(12) United States Patent
Birner et al.

(10) Patent No.: US 9,543,260 B2
(45) Date of Patent: Jan. 10, 2017

(54) SEGMENTED BOND PADS AND METHODS OF FABRICATION THEREOF

(71) Applicant: Infineon Technologies AG, Neubiberg (DE)

(72) Inventors: Albert Birner, Regensburg (DE); Helmut Brech, Lappersdorf (DE); Matthias Zigldrum, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 13/958,276

(22) Filed: Aug. 2, 2013

(65) Prior Publication Data

US 2015/0035171 A1  Feb. 5, 2015

(51) Int. Cl.
*H01L 23/538* (2006.01)
*H01L 23/00* (2006.01)

(52) U.S. Cl.
CPC ............. *H01L 24/06* (2013.01); *H01L 24/03* (2013.01); *H01L 24/05* (2013.01); *H01L 24/09* (2013.01); *H01L 24/40* (2013.01); *H01L 24/48* (2013.01); *H01L 24/49* (2013.01); *H01L 24/70* (2013.01); *H01L 24/73* (2013.01); *H01L 2224/03831* (2013.01); *H01L 2224/04042* (2013.01); *H01L 2224/04073* (2013.01); *H01L 2224/05552* (2013.01); *H01L 2224/05553* (2013.01); *H01L 2224/05554* (2013.01); *H01L 2224/05557* (2013.01); *H01L 2224/05578* (2013.01); *H01L 2224/05599* (2013.01); *H01L 2224/0603* (2013.01); *H01L 2224/06133* (2013.01); *H01L 2224/06153* (2013.01); *H01L 2224/09133* (2013.01); *H01L 2224/09153* (2013.01); *H01L 2224/40095* (2013.01); *H01L 2224/40245* (2013.01); *H01L 2224/40247* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/45157* (2013.01); *H01L 2224/45166* (2013.01); *H01L 2224/45169* (2013.01); *H01L 2224/45176* (2013.01); *H01L 2224/45181* (2013.01); *H01L 2224/45184* (2013.01);

(Continued)

(58) Field of Classification Search
CPC .......... H01L 24/06; H01L 24/05; H01L 24/03; H01L 24/09
See application file for complete search history.

(56) References Cited

U.S. PATENT DOCUMENTS 8,890,339 B1   11/2014  Santos et al.
2001/0034119 A1*  10/2001  Morozumi .................... 438/622

(Continued)

FOREIGN PATENT DOCUMENTS

| JP | 63136637 A | 6/1988 |
| JP | 2000269260 A | 9/2000 |
| JP | 2013051295 A | 3/2013 |

*Primary Examiner* — Mark Armand
*Assistant Examiner* — Sarah Salerno
(74) *Attorney, Agent, or Firm* — Slater Matsil, LLP

(57) ABSTRACT

In accordance with an embodiment of the present invention, a semiconductor device includes a first bond pad disposed at a first side of a substrate. The first bond pad includes a first plurality of pad segments. At least one pad segment of the first plurality of pad segments is electrically isolated from the remaining pad segments of the first plurality of pad segments.

31 Claims, 24 Drawing Sheets

(52) U.S. Cl.
CPC ............... *H01L 2224/4847* (2013.01); *H01L 2224/48091* (2013.01); *H01L 2224/48101* (2013.01); *H01L 2224/48153* (2013.01); *H01L 2224/48247* (2013.01); *H01L 2224/48453* (2013.01); *H01L 2224/48463* (2013.01); *H01L 2224/48465* (2013.01); *H01L 2224/49111* (2013.01); *H01L 2224/49175* (2013.01); *H01L 2224/73271* (2013.01); *H01L 2224/85181* (2013.01); *H01L 2224/85205* (2013.01); *H01L 2224/85207* (2013.01); *H01L 2224/85399* (2013.01); *H01L 2924/00014* (2013.01); *H01L 2924/01013* (2013.01); *H01L 2924/01029* (2013.01); *H01L 2924/01079* (2013.01); *H01L 2924/053* (2013.01); *H01L 2924/1033* (2013.01); *H01L 2924/10272* (2013.01); *H01L 2924/1205* (2013.01); *H01L 2924/12031* (2013.01); *H01L 2924/12032* (2013.01); *H01L 2924/1301* (2013.01); *H01L 2924/1304* (2013.01); *H01L 2924/1305* (2013.01); *H01L 2924/13055* (2013.01); *H01L 2924/13062* (2013.01); *H01L 2924/13091* (2013.01); *H01L 2924/14* (2013.01); *H01L 2924/181* (2013.01)

(56) References Cited

U.S. PATENT DOCUMENTS

| | | | |
|---|---|---|---|
| 2006/0097386 A1* | 5/2006 | Ertle et al. | 257/723 |
| 2010/0164096 A1* | 7/2010 | Daubenspeck | H01L 24/03 257/737 |
| 2013/0087930 A1* | 4/2013 | Meinhold | 257/782 |

* cited by examiner

SEGMENTED BOND PADS AND METHODS OF FABRICATION THEREOF

TECHNICAL FIELD

The present invention relates generally to semiconductor devices, and more particularly to segmented bond pads and methods of fabrication thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged.

Electrical connections between the semiconductor device and other devices are made using one or more contact pads, or bond pads. These bond pads are arranged on the semiconductor device. Wire bonds may be used to electrically connect the bond pads of the semiconductor device to components external to the chip. For example, in some applications, wire bonds are used to connect the bond pads of a semiconductor device to a lead frame or a substrate, among others.

Many different types of wire bonding techniques may be used to establish these electrical connections between components, depending on the type of semiconductor device implemented. Ball bonding, ultrasonic bonding (e.g., wedge bonding), or other types of wire bonding may be used.

SUMMARY OF THE INVENTION

In accordance with an embodiment of the present invention, a semiconductor device comprises a first bond pad disposed at a first side of a substrate. The first bond pad comprises a first plurality of pad segments. At least one pad segment of the first plurality of pad segments is electrically isolated from the remaining pad segments of the first plurality of pad segments.

In accordance with an alternative embodiment of the present invention, a semiconductor device comprises a first bond pad disposed at a first side of a substrate. The first bond pad comprises a first portion and a second portion. The first portion of the first bond pad is electrically coupled to the substrate, and the second portion of the first bond pad is electrically isolated from the substrate.

In accordance with yet another alternative embodiment of the present invention, a semiconductor device comprises a semiconductor chip having a first side, and a first bond pad disposed at the first side of the semiconductor chip. The first bond pad comprises a first portion and a second portion comprising a first plurality of pad segments. A pad segment of the first plurality of pad segments is electrically isolated from the remaining pad segments of the first plurality of pad segments. A first external interconnect contacting the first portion of the first bond pad.

In accordance with yet another alternative embodiment of the present invention, a semiconductor device comprises a semiconductor chip having a first side, and a first bond pad disposed at the first side of the semiconductor chip. The first bond pad comprises a first portion and a second portion separated from the first portion. The first portion of the first bond pad is electrically coupled to the substrate, and the second portion of the first bond pad is electrically isolated from the substrate. A first external interconnect contacts the first portion.

In accordance with yet another alternative embodiment of the present invention, a method of forming a semiconductor device comprises forming an isolation layer over a substrate, patterning the isolation layer to form a first plurality of openings, and forming a bond pad comprising a plurality of bond pad segments by at least partially filling the first plurality of openings with a conductive material

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1A and 1B, wherein

FIG. 2, which includes FIGS. 2A and 2B, illustrates a semiconductor device in accordance with an embodiment of the present invention, wherein FIG. 2A shows a top view of a semiconductor chip with a bond pad, while FIG. 2B shows a top view with active and inactive areas of the bond pad;

FIG. 4, which includes FIGS. 4A and 4B illustrate cross sectional views of the semiconductor chip and FIG. 4C shows a top view of the semiconductor chip.

FIG. 8, which includes

FIG. 9, which includes

FIG. 10, which includes

FIG. 11, which includes

FIG. 13, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In semiconductor device technology, parasitic effects can result in degradation of the electrical performance of the semiconductor chips. Such parasitic effects may result from packaging as well as within components of the semiconductor chip. One such parasitic effect arises from the bond pad used to couple the semiconductor chip to external circuitry. As an example, the electrical performance of high performance devices may be impacted by parasitic capacitances arising from the bond pad. For example, the characteristics of radio-frequency transistors is strongly degraded as drain-source or output to ground capacitance increases. Similarly, electrical performance may also be degraded as gate capacitance increases. To combat this problem, in some applications, the contribution of the bond pad to this capacitance value is lowered. Particularly, bond pad capacitance is lowered by maximizing the thickness of the underlying dielectric stack or minimizing the dielectric constant of that material by employing low-k materials. However, significant shortcomings remain. For example, as the dielectric constant approaches 3.0 or below, mechanical stability of the wire bond becomes a concern. Moreover, the thickness of the dielectric layer may only be altered within a certain range determined by the backend-of-line metallization stack.

Various embodiments of the present invention provide a semiconductor device with a segmented bond pad that limits the electrically active area of the bond pad. A first part of the bond pad is electrically active in a continuous way while a second part of the bond pad is fabricated such that it provides mechanical support but is isolated from the wire bond, thereby decreasing the area of the pad contributing to the bond pad capacitance. Therefore, without necessarily altering the thickness or dielectric constant of the dielectric stack, parasitic capacitances due to the bond pad may be reduced.

A structural embodiment of the invention will be described using FIG. 1. Alternative structural embodiments of the present invention will be described using FIGS. 2-5 9, and 10. A method of fabricating the semiconductor device will be described using FIG. 6. Alternative embodiments of fabricating the semiconductor device will be described using FIGS. 7 and 8.

Figure 1A:
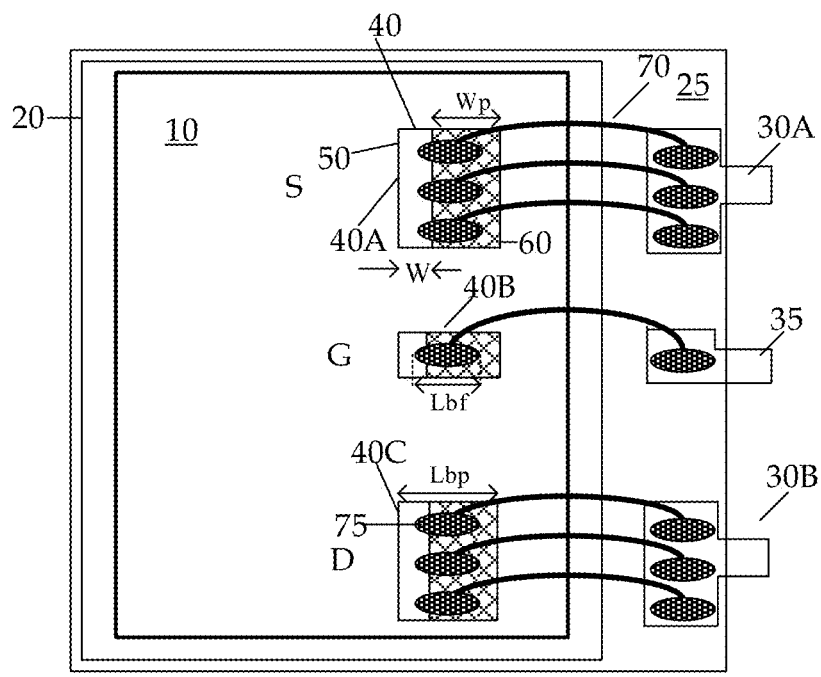
FIG. 1A illustrates a semiconductor device in accordance with an embodiment of the present invention and FIG. 1B illustrates the improvement in performance of the semiconductor device.
Figure 1B:
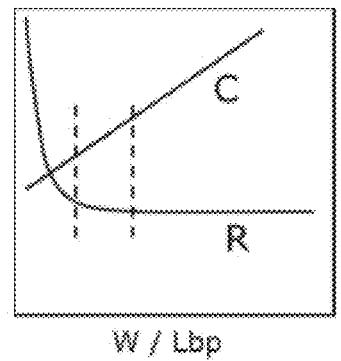

FIG. 1, which includes FIGS. 1A and 1B, illustrates embodiments of the present invention. FIG. 1A illustrates a semiconductor device in accordance with an embodiment of the present invention and FIG. 1B illustrates the corresponding improvement in performance of the semiconductor device.

Referring to FIG. 1A, a semiconductor chip 10 is arranged on a substrate 20. In various embodiments, the semiconductor chip 10 may comprise an integrated circuit chip or a discrete device. In one or more embodiments, the semiconductor chip 10 may comprise a logic chip, a memory chip, an analog chip, a mixed signal chip, a discrete device, and combinations thereof such as a system on chip, or other suitable types of devices. The semiconductor chip 10 may comprise various types of active and passive devices such as diodes, transistors, thyristors, capacitors, inductors, resistors, optoelectronic devices, sensors, micro-electro-mechanical systems, and others.

In this illustrative example, the semiconductor chip 10 is attached to the substrate 20. The substrate 20 may be a conductive substrate in some examples. For instance, the substrate 20 may comprise copper in one embodiment. In other embodiments, the substrate 20 comprises a metallic material which may include conductive metals and their alloys. The substrate 20 may also include intermetallic material.

The substrate 20 may comprise a lead frame in one embodiment. For example, in one embodiment the substrate 20 may comprise a die paddle over which the semiconductor chip 10 may be attached. First and second leads 30 and 35 also may be present in this example. The first lead 30 including a source lead 30A and a drain lead 30B may provide a source connection and/or a drain connection and the second lead 35 may provide a gate connection in this embodiment. In further embodiments, the substrate 20 may comprise one or more die paddles over which one or more chips may be attached.

In another alternative embodiment, the substrate 20 may not be conductive. In still other embodiments, several different or identical semiconductor chips 10 may be attached on the substrate 20 by different techniques.

Various embodiments form the semiconductor chip 10 on a silicon substrate. Alternatively, in other embodiments, the semiconductor chip 10 may have been formed on silicon carbide (SiC) or may have been formed at least partially on a compound semiconductor such as gallium nitride (GaN).

In some illustrative examples, the semiconductor chip 10 may comprise a power semiconductor device, which may be a discrete device in one embodiment. In one example, the semiconductor chip 10 is a two terminal device such as a PIN diode or a Schottky diode. In other examples, the semiconductor chip 10 is a three terminal device such as a power metal insulator semiconductor field effect transistor (MISFET), a junction field effect transistor (JFET), bipolar junction transistor (BJT), an insulated gate bipolar transistor (IGBT), or a thyristor. In still other examples, the semiconductor chip 10 may be a laterally diffused metal oxide semiconductor (LDMOS).

As depicted, the semiconductor chip 10 comprises a bond pad 40 (also referred to as a contact pad or simply pad). In this illustrative example, the bond pad 40 is deposited on the upper surface of the semiconductor chip 10. In other examples, the semiconductor chip 10 may comprise additional bond pads on one or more other surfaces. For instance, the semiconductor chip 10 may include bond pads on its bottom surface.

Each of the bond pad 40 on the semiconductor chip 10 has a first portion 50 separated from a second portion 60 in this embodiment. A plurality of wires 70 electrically connects the first portion 50 of the bond pad 40 to the first and the second leads 30 and 35. One or more of the first portion 50 and the second portion 60 of the bond pad 40 may be segmented, as shown in detail with reference to FIGS. 2-5.

In some embodiments, only some of the bond pads 40 on the semiconductor chip 10 have a first portion 50 and a second portion 60. For example, the bond pads 40 may comprise a first bond pad 40A, a second bond pad 40B, and a third bond pad 40C in some embodiments.

In one embodiment, the wires 70 are formed as wedge bonds. During wedge bonding, pressure and ultrasonic forces are applied to a wire to form a wedge bond on a bond pad 40 of the semiconductor chip 10. The wire is run to an external contact, such as the first lead 30, forming a gradual wire arc between the bond pad and the lead finger. Pressure and ultrasonic forces are again applied to the wire, forming a wedge bond on the lead finger, and the wire is subsequently broken using a clamping device. This technique may be used to form the wedge bonds shown in FIG. 1. In various embodiments, the wedge portion of each of the wires 70 is known as the bond foot. For example, in this embodiment, a bond foot 75 is depicted. Of course, other techniques may be used to deposit the wires 70.

In alternative embodiments, ball bonds may be used for the wires 70. With ball bonding, a metal ball is first formed by melting the end of the wire. The ball is placed on the bond pad and pressure, heat, and ultrasonic forces are applied to the ball for a specified amount of time. As a result, a metallurgical weld between the ball and the bond pad is formed. Similar to wedge bonding, the wire is run to the external contact where another bond is formed, the wire is severed, and the process repeats itself for additional wire bonds for the semiconductor device. The second bond may be a wedge bond, a stitch bond, or some other type of bond.

In one or more embodiments, the wire bond material for the wires 70 may comprise copper, aluminum, and gold, among others. In other embodiments, the wire bond material may comprise tungsten, titanium, tantalum, ruthenium, nickel, cobalt, platinum, silver, and such other materials. In various embodiments, the bond pad 40 may comprise one or more of the aforementioned materials. In this example, the bond pad 40 comprises gold.

The semiconductor chip 10, the substrate 20, and the wires 70, and the interconnect 71 may all be embedded in an encapsulant 25. In various embodiments, the encapsulant 25 comprises a dielectric material and may include a mold compound in one embodiment. In one or more embodiments, the encapsulant 25 may comprise one or more of a polymer, a copolymer, a biopolymer, a fiber impregnated polymer (e.g., carbon or glass fibers in a resin), a particle filled polymer, and other organic materials. In still other illustrative examples, the encapsulant 25 may comprise a sealant not formed using a mold compound, and materials such as epoxy resins and/or silicones. In various embodiments, the encapsulant 25 may be made of any appropriate duroplastic, thermoplastic, a thermosetting material, or a laminate, and may include filler materials in some embodiments. In another embodiment, the encapsulant 25 may comprise epoxy material and a fill material comprising small particles of glass or other electrically insulating mineral filler materials like alumina or organic fill materials.

The bond foot 75 may have a length (Lbf), which is about 0.2 to about 0.7 times the length of the bond pad 40 (Lbp), for example, about 0.5 Lbp in one embodiment. In various embodiments, the bond foot 75 is made to be as small as possible, i.e., at minimum feature size for the technology. In various embodiments, the ratio of the area of the first portion 50 and the second portion 60 is selected to maximize the performance of the semiconductor chip 10. This is further described using FIG. 1B.

Referring to FIG. 1B, the graph illustrates schematically, the effect of varying the area of the first portion 50 and the area of the second portion 60. As the area of the first portion 50 is directly electrically connected to the underlying components, increasing the area of the first portion 50 results in a decrease in resistance at the interface between the wire 70 and the bond pad 40. However, this resistance drops off rather quickly. To illustrate this effect, the ratio of the width of the first portion 50 W relative to the length of the bond pad 40 (Lbp) is shown in FIG. 1B. However, increasing the first portion 50 also increases the parasitic capacitance of the bond pad 40. Thus, there is an optimum working range at which the resistance and capacitance are minimized. Accordingly, in various embodiments, the ratio W:Lbp is at least 0.1:1 to minimize resistance. However, in various embodiments, the ratio W:Lbp is not larger than 0.7:1 to minimize parasitic capacitances. In various embodiments, the pad capacitance is lowered without sacrificing contact resistance.

Figure 2A:
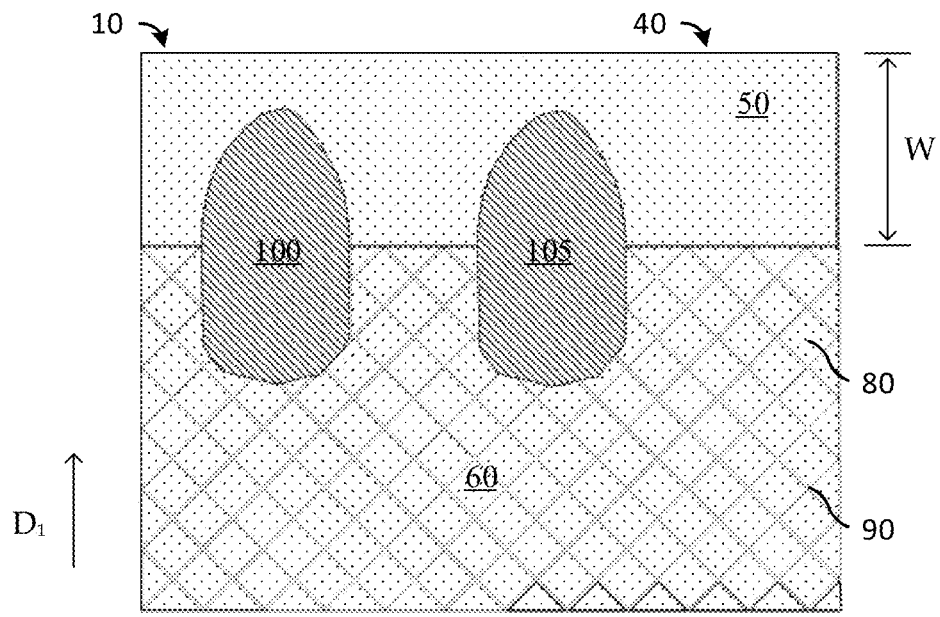
Figure 2B:
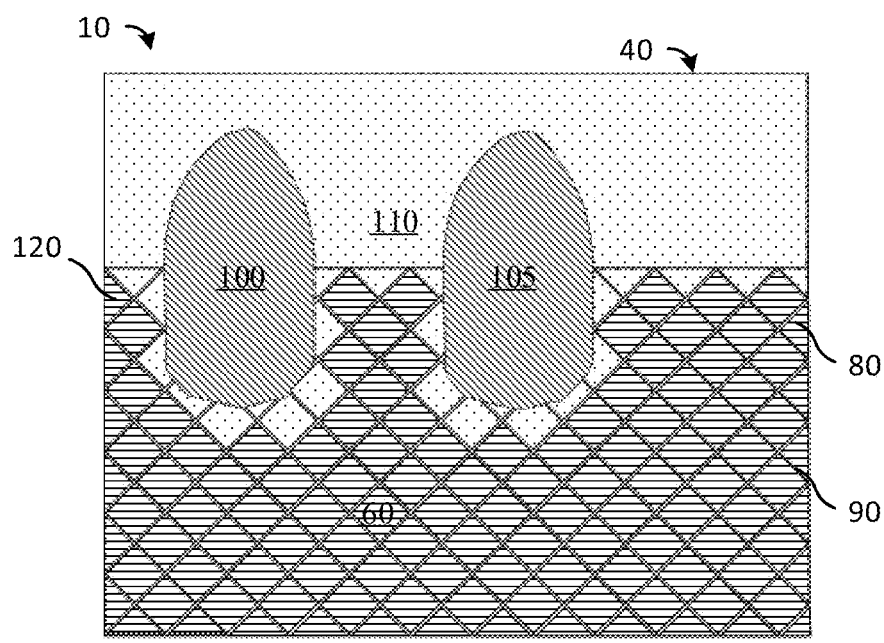

FIG. 2, which includes FIGS. 2A and 2B, illustrates a semiconductor device in accordance with an embodiment of the present invention. In particular, FIG. 2A shows a magnified top view of a semiconductor chip with a bond pad, while FIG. 2B shows the top view highlighting active and inactive areas of the bond pad. In one embodiment, FIG. 2 illustrates a magnified view of the semiconductor chip 10 illustrated in FIG. 1.

Referring to FIG. 2A, a top view of the semiconductor chip 10 with the bond pad 40 is shown. As illustrated in this embodiment, the bond pad 40 includes the first portion 50 and the second portion 60. In various embodiments, the bond pad 40 may be 50-250 µm in diameter, depending on the type of wire bond used for the semiconductor chip 10. In some embodiments, it may be desirable to minimize the size of the bond pad to further decrease the bond pad to substrate capacitance. The size of the bond pad 40 may depend on a variety of factors such as wire bond pitch and wire bond foot width, among others.

In these examples, the first portion 50 may be a continuous portion, while the second portion 60 is segmented into a plurality of pad segments 80. Trenches 90 are present between each of the pad segments 80. The trenches 90 in the second portion 60 of the bond pad 40 separate the pad segments 80 and make the isolated pad segments 80 inactive while still mechanically present in these illustrative examples. In various embodiments, the trenches 90 may be 0.2-5 µm in width. Particularly, the trenches 90 may be 2-3 µm in width to further minimize the size of the bond pad 40 in some embodiments. In various embodiments, the ratio of the width of the trenches 90 to the length (or width) of each of the plurality of pad segments 80 is about 1:2 to about 1:50, and 1:10 in one embodiment.

As can be seen from this illustrative example, in some embodiments, the trenches 90 are formed such that the pad segments 80 appear to be rotated 45 degrees from the direction of the wires ("$D_1$"). In this configuration, the pad segments 80 may have a greater tolerance to shear stress during the wire bonding process. In alternative embodiments, the trenches 90 may be configured differently to aid in increasing the shear strength of the second portion 60 of the bond pad 40.

In various embodiments, one or more of the trenches 90 may be filled with an isolating material such as a dielectric material. The dielectric material may comprise a nitride in one or more embodiments. In other embodiments, the dielectric material may comprise an oxide, silicon carbide, silicon oxynitride, hafnium oxide, aluminum oxide, other dielectric constant materials, polyimide, and other organic materials. In still other illustrative embodiments, the dielectric material may comprise a gap, which may be filled with air.

As depicted, the first portion 50 of the bond pad 40 may have a width ("W") of 80 μm along the direction $D_1$. In other embodiments, the first portion 50 of the bond pad 40 may have other widths such as 60 μm, 100 μm, 120 μm, and other suitable widths.

A first wire bond with a first bond foot 100 is arranged over the bond pad 40. In particular, one part of the first bond foot 100 is arranged on the first portion 50 and another part of the first bond foot 100 is arranged on the second portion 60 of the bond pad 40. The first bond foot 100 is one example of the bond foot 75 of the wedge wire bond shown in FIG. 1. In alternative embodiments where a ball bond is used, the shape of the first bond foot 100 may be circular, or may have a variable shape depending on the manner in which the metal wire melts to the bond pad 40.

In various embodiments, the first bond foot 100 may be arranged on the bond pad 40 using a number of alignment tools. In one example, the first bond foot 100 is about 60 μm in length with 40 μm arranged on the first portion 50 of the bond pad 40.

A second wire bond with a second bond foot 105 is spaced from the first bond foot 100. The second bond foot 105 is also about 60 μm in length with about 40 μm arranged on the first portion 50 of the bond pad 40. Additional wire bonds also may be arranged on the bond pad 40 in various embodiments. In various embodiments, the first bond foot 100 and the second bond foot 105 are made of gold, copper, or aluminum. In one embodiment, the first bond foot 100 and the second bond foot 105 are made of gold and have a wire pitch of 120 μm, which is the distance between the center of first bond foot 100 and second bond foot 105.

Note that only for illustration, the pad segments that are directly underneath or overlapping with the first bond foot 100 or the second bond foot 105 are not shown.

In an alternative embodiment, the semiconductor chip 10 with the bond pad 40 includes the first bond foot 100 and the second bond foot 105 comprised of copper. In such an alternative embodiment, the first bond foot 100 and the second bond foot 105 may have a minimum pitch of 160 μm. In various embodiments, because of the thicker wires, the size of the copper wire bonds is larger than the gold wire bonds. Accordingly, the size of the first portion 50 and/or the overlap between the wire and the first portion 50 may be changed. In this example, the upper portion 50 has a width of 80 μm. If the overlap of the wire with the first portion 50 is maintained as in prior embodiments (e.g., about 40 μm), the overlap with the second portion 60 increases due to the long bond foot associated with the thicker wires. Accordingly, in various embodiments, the ratio of length of bond foot overlapping the first portion 50 to the length of bond foot overlapping the second portion 60 is about 5:1 to about 1:5, and about 2:3 in one embodiment.

In yet another embodiment, the first bond foot 100 and the second bond foot 105 are comprised of copper with a minimum pitch, for example, of 160 μm. As illustrated, the first portion 50 has a width W of about 100 μm and therefore, more of the bond pad 40 is included in the active area 110 than in previous embodiments. Accordingly, in various embodiments, the ratio of length of bond foot overlapping the first portion 50 to the length of bond foot overlapping the second portion 60 is about 3:2 in the illustrated embodiment.

FIG. 2B illustrates the semiconductor chip 10 with an active area 110 and an inactive area 120. In this embodiment, the active area 110 corresponds to the area of the bond pad 40 that is electrically active.

As illustrated, the active area 110 includes the first portion 50 and the pad segments 80 directly connected to the first bond foot 100 and the second bond foot 105. The pad segments 80 directly underneath the first and the second bond foots 100 and 105 are part of the active area 110. The pad segments 80 that are not directly connected to the first and the second bond foots 100 and 105 form the inactive area 120 and are electrically isolated from the active pad segments 80 in this illustrative example.

The trenches 90 between the pad segments 80 serve to isolate the inactive segments from the active segments. Therefore, the trenches 90 have a width sufficient to isolate each segment. This width may vary depending on the type of semiconductor chip used.

In various embodiments, the ratio of length of bond foot overlapping the first portion 50 to the length of bond foot overlapping second portion 60 is about 5:1 to about 1:5, for example, 1:1. In other examples, the ratio may be 2:1 to about 1:2, or some other suitable ratio.

With the use of an illustrative embodiment including the inactive pad segments 80, parasitic bond pad capacitance may be reduced by reducing the active area 110 of the bond pad 40. As a result, the semiconductor chip 10 may operate more efficiently and effectively.

Figure 3:
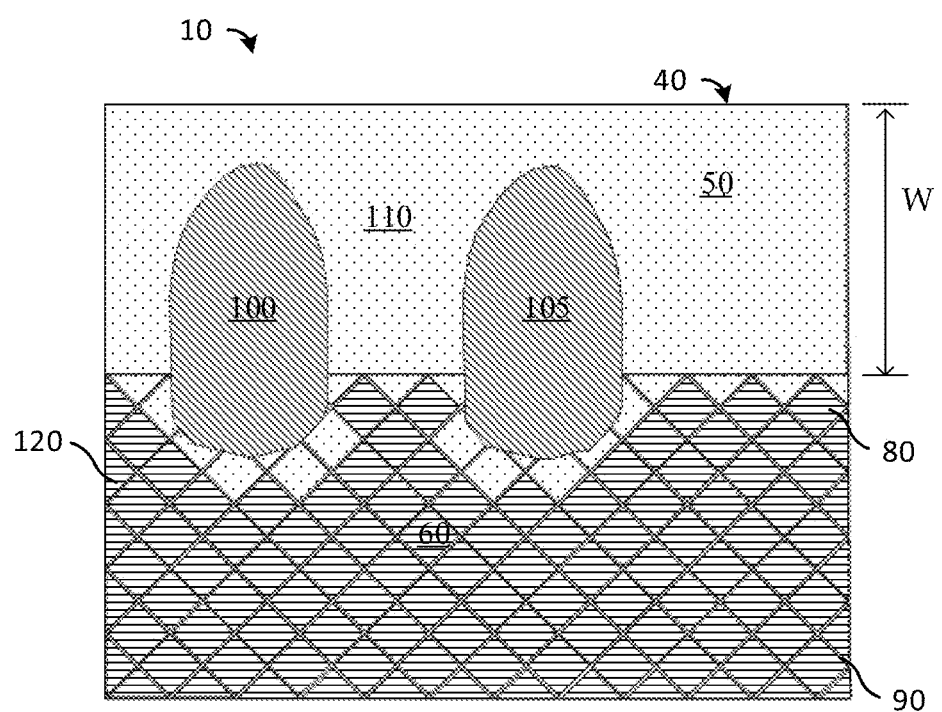
FIG. 3 illustrates another semiconductor device in accordance with an embodiment of the present invention.

FIG. 3 illustrates a semiconductor device in accordance with an embodiment of the present invention. In this example, the first bond foot 100 and the second bond foot 105 may comprise a conductive material such as gold and have a minimum wire pitch of 120 μm. The first bond foot 100 and the second bond foot 105 are arranged such that about 60 μm is connected to the first portion 50 of the bond pad 40, while about 20 μm is connected to the pad segments 80 in the second portion 60 of the bond pad 40. Accordingly, in this illustration, the ratio of length of bond foot overlapping the first portion 50 to the length of bond foot overlapping second portion 60 is about 3:1.

In this embodiment, the active area 110 of the bond pad 40 is shown. The active area 110 includes the first portion 50 as well as the pad segments 80 that are directly connected to the first bond foot 100 and second bond foot 105.

Similar to the embodiment shown in FIG. 2B, the trenches 90 in this embodiment electrically isolate the pad segments 80 not directly contacting the first and second bond foots 100 and 105 from the active area 110 of the bond pad 40. As a result, the inactive area 120 is formed. Accordingly, only the active area 110 contributes to the parasitic bond pad capacitance in this illustrative embodiment. Additionally, that part of the area 60 that is not included in area 120 provides mechanical support and increases shear strength of the wire bonds.

Figure 4A:
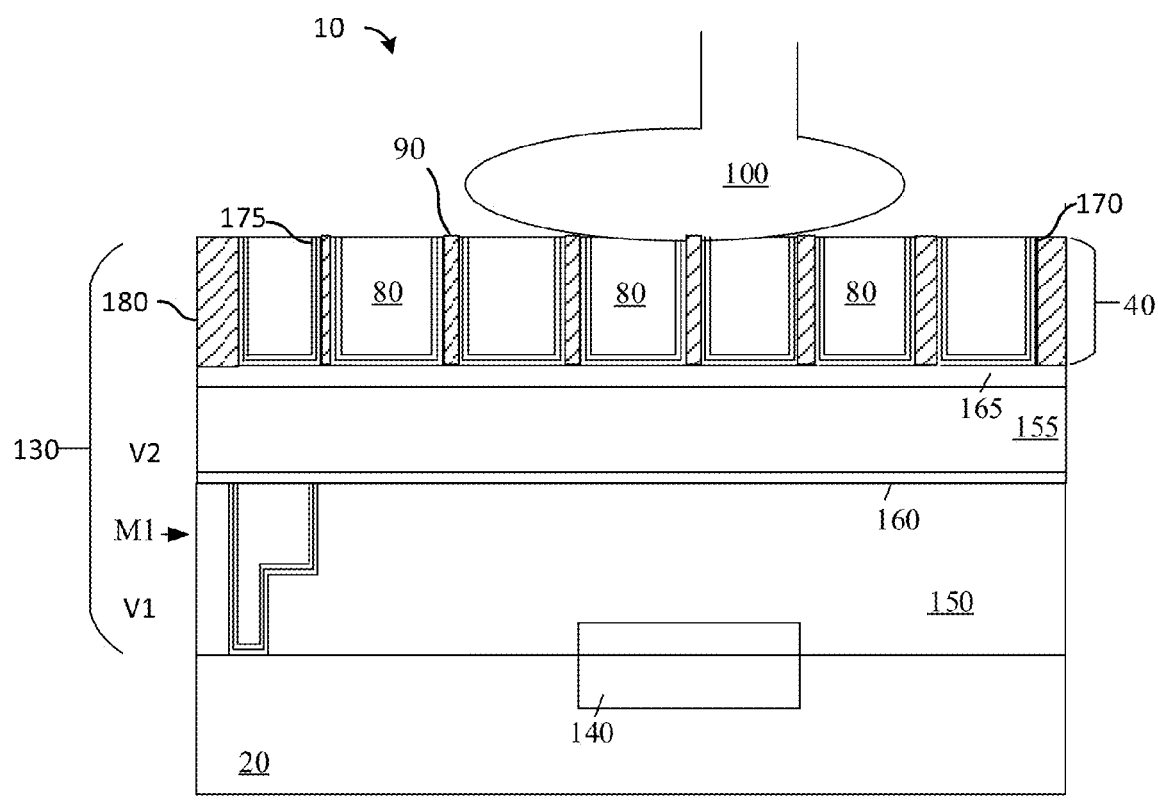
FIGS. 4A-4C, illustrates a semiconductor device in accordance with embodiments of the present invention.
Figure 4B:
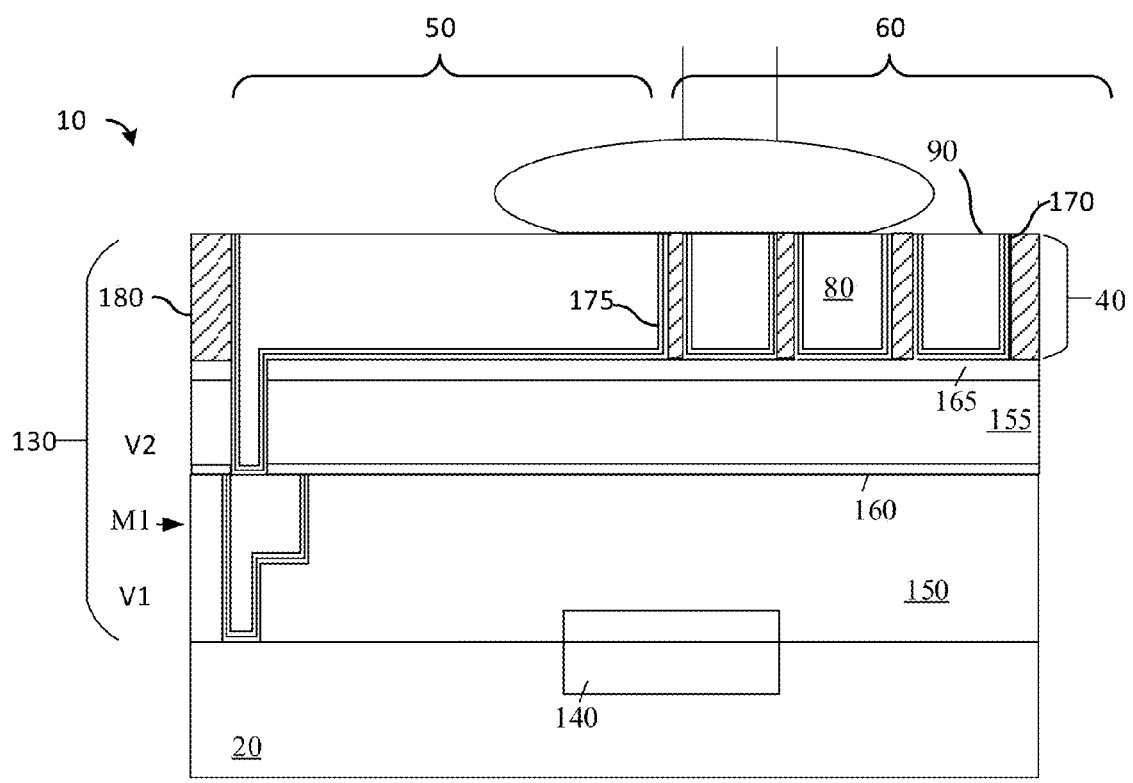
Figure 4C:
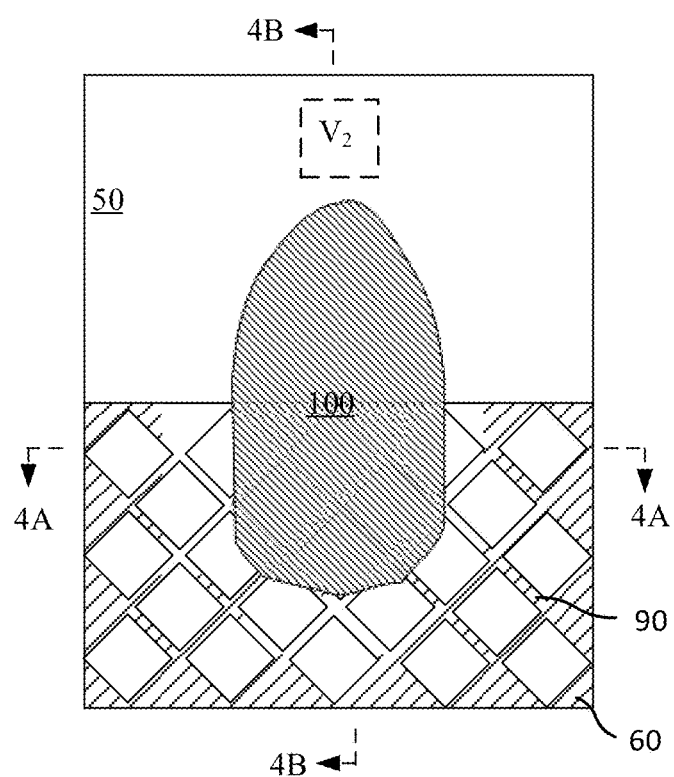

FIG. 4, which includes FIGS. 4A-4C, illustrates a semiconductor device in accordance with embodiments of the present invention. FIG. 4A shows a cross sectional view of the semiconductor chip 10 taken along the lines 4A-4A in FIG. 4C, FIG. 4B shows a cross sectional view of the semiconductor chip 10 taken along the lines 4B-4B in FIG. 4C, and FIG. 4C shows a top view of the semiconductor chip 10.

Referring to FIGS. 4A and 4B, the bond pad 40 is formed over the substrate 20. The substrate 20 may include active devices formed within. A set of metallization layers 130 is disposed over the substrate 20, which may comprise one or more levels of metal lines and vias in various embodiments.

For example, the metallization layer 130 may comprise ten or more metal levels in one embodiment. In another embodiment, the metallization layer 130 may comprise three metal layers. In another embodiment, the metallization layer 130 may comprise two layers.

The metallization layer 130 may couple various devices within the semiconductor chip 10 in one embodiment. In another embodiment, the metallization layer 130 forms contacts to different regions of a discrete semiconductor device.

In various embodiments, the bond pad 40 is coupled to active devices in the substrate 20 such as a first device 140. The first device 140 may be a transistor, capacitor, diode, thyristor, and other devices in various embodiments. The bond pad 40 may be a top metallization layer of a multilevel metallization in one embodiment. A plurality of metal lines and vias disposed within the metallization layer 130 may couple the active devices in the substrate 20 with the bond pad 40.

For brevity, FIGS. 4A and 4B illustrate a two layer metallization. The metallization layer 130 has a first via level V1, a first metal level M1, and a second via level V2 coupled to the bond pad 40. In one embodiment, the bond pad 40 is a metal level formed on the uppermost metal level of the semiconductor chip 10.

Each of the metallization levels may include an inter-level dielectric layer. For example, a first inter level dielectric layer 150 is deposited over the substrate 20. A second inter level dielectric layer 155 is deposited over the first inter level dielectric layer 150.

The inter-level dielectric layers may be separated by etch stop liners. For example, a first etch stop liner 160 is deposited between the first and the second inter level dielectric layers 150 and 155. A second etch stop liner 165 is deposited between the second inter level dielectric layer 155 and the bond pad 40.

In the illustrated embodiments, the conductive features forming the metal lines and vias (e.g., in M1, V1, V2) are formed using a dual damascene process. In alternative embodiments, the conductive features may be formed using a damascene process or a combination of single and dual damascene processes.

Each conductive feature may include a metal liner, which may include multiple layers. For example, the metal liner may include a first metal liner 170 and a second metal liner 175 in some embodiments. The first metal liner 170 may be a diffusion barrier while the second metal liner 175 may be a seed layer. As illustrated in FIG. 4A, the bond pad 40 includes a plurality of trenches 90.

In FIGS. 4A and 4B, a filler material 180 may at least partially fill the trenches 90. The filler material 180 may be a dielectric material such as an oxide or other materials discussed with respect to FIG. 2.

In other examples, the filler material 180 may include an encapsulant. In various embodiments, the encapsulant comprises a dielectric material as described above.

As illustrated, the first bond foot 100 makes an electrical connection to two of the pad segments 80. The other pad segments 80 are electrically isolated from the first bond foot 100 by the trenches 90 containing the filler material 180. In this manner, only the electrically active regions of the bond pad 40 contribute to the parasitic bond pad capacitance, but the remaining pad segments 80 contribute to the mechanical stability of the wire bond while remaining electrically inactive. As a result, the parasitic bond pad capacitance may be reduced by, for example, 40-60%. For illustration only a portion of the bond pad 40 is shown. Therefore, the number of pad segments 80 illustrated in FIG. 4 may not be representative of the actual cross-section.

FIG. 4C illustrates a top view and shows that the trenches 90 are dispersed within the bond pad 40. Each bond pad 40 may include an array of trenches 90 that form the pad segments 80 shown in FIGS. 1-5. FIG. 4C illustrates five rows and six columns only as an illustration.

Figure 5:
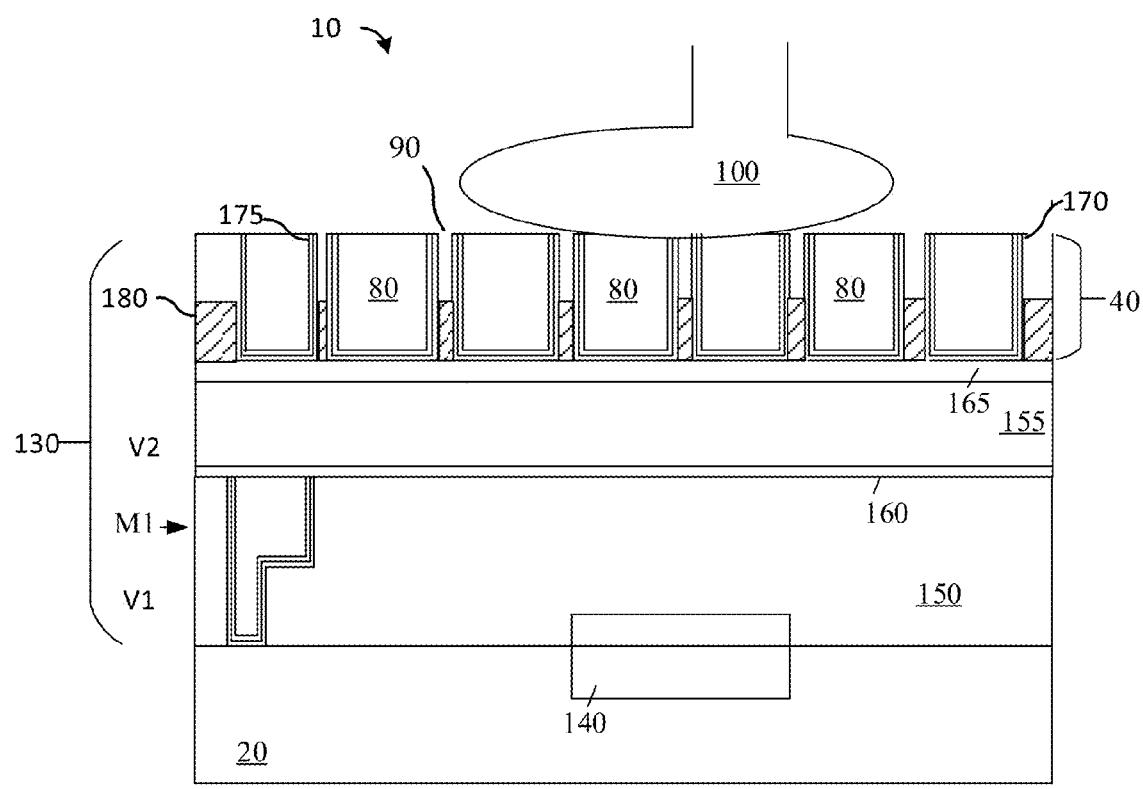
FIG. 5 illustrates yet another semiconductor device in accordance with an alternative embodiment of the invention.

FIG. 5 illustrates yet another semiconductor device in accordance with an alternative embodiment of the invention. FIG. 5 is a cross-sectional view similar to FIG. 4A. In this embodiment, the filler material 180 fills only a portion of the trenches 90 between the pad segments 80 of the bond pad 40. For example, the filler material 180 may fill 50 percent of the trenches 90. Alternatively, the filler material 180 may fill more or less of the trenches 90, depending on the functionality involved. In still other embodiments, some of the trenches 90 may comprise the filler material 180 while other trenches 90 comprise less or no filler material 180.

Figure 6:
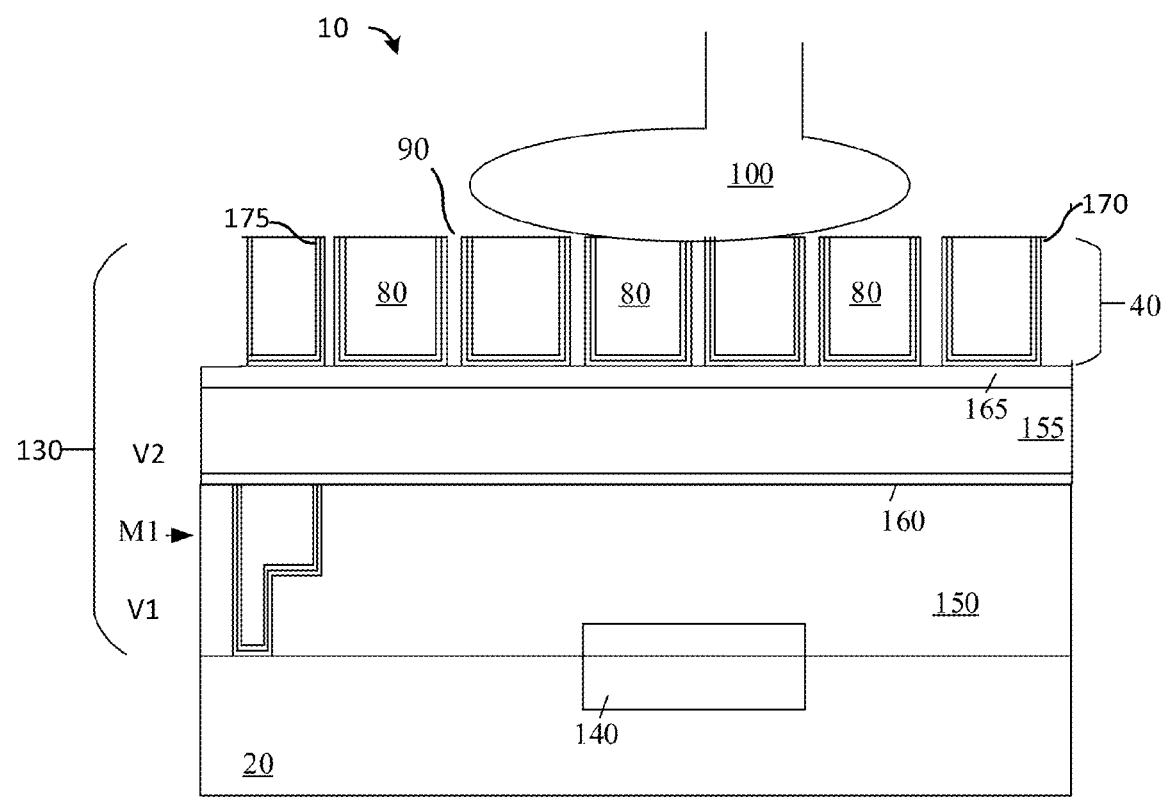
FIG. 6 illustrates yet another semiconductor device in accordance with an alternative embodiment of the invention.

FIG. 6 illustrates yet another semiconductor device in accordance with an alternative embodiment of the invention. FIG. 6 is a cross-sectional view similar to FIG. 4A. In this embodiment, the trenches 90 between the pad segments 80 of the bond pad 40 are not filled with an insulating material.

Figure 7:
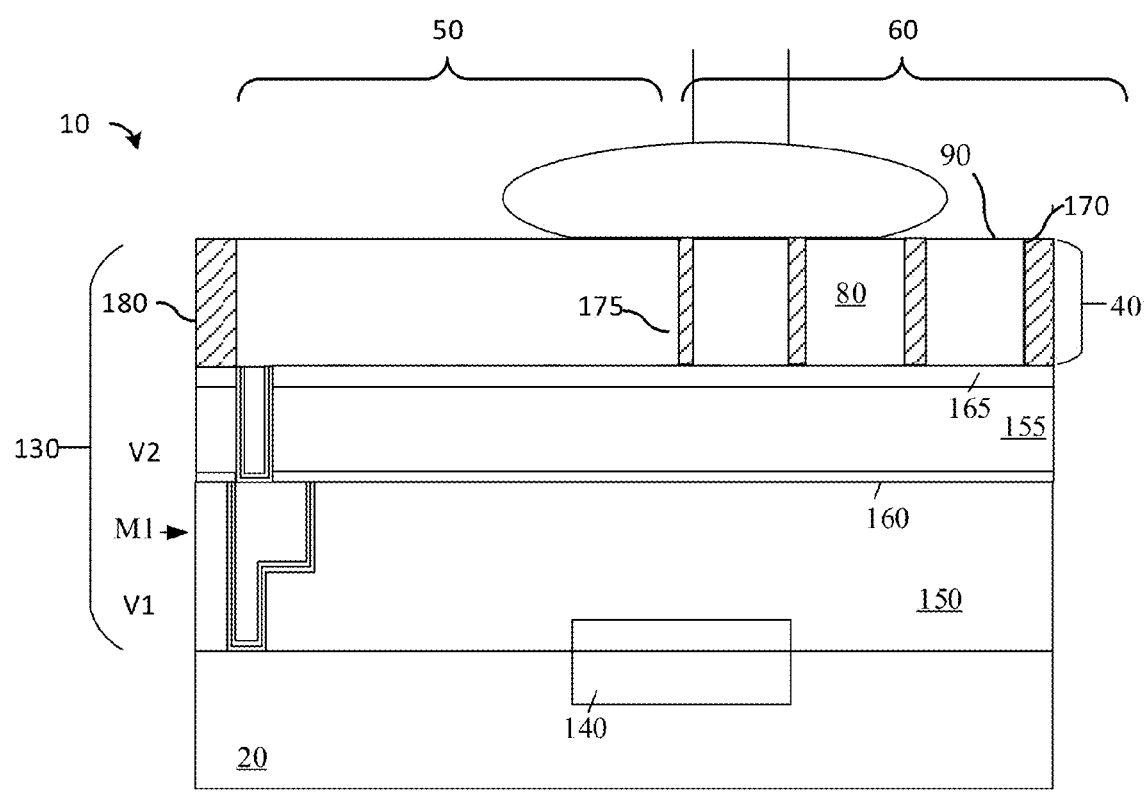
FIG. 7 illustrates yet another semiconductor device in accordance with an alternative embodiment of the invention.

FIG. 7 illustrates yet another semiconductor device in accordance with an alternative embodiment of the invention. FIG. 7 is a cross-sectional view similar to FIG. 4B. FIG. 7 illustrates a bond pad formed without using a damascene process. Therefore, the bond pad 40 in FIG. 7 may not a have continuous fill material as illustrated in FIGS. 4-6. In one embodiment, the bond pad 40 in FIG. 7 comprises an aluminum pad, which may be protected using barrier liners such as titanium nitride or tungsten nitride. Alternatively, in another embodiment, the bond pad 40 may comprise a gold pad and may not include additional barriers or protective liners.

Figure 8A:
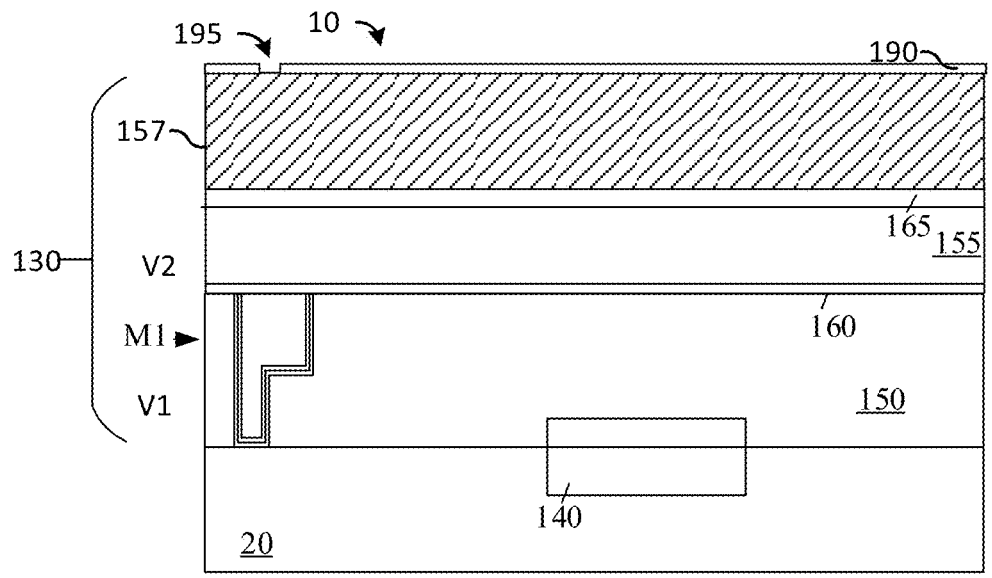
FIGS. 8A-8F, illustrates one process for making a semiconductor structure in accordance with embodiments of the present invention.

FIG. 8, which includes FIGS. 8A-8F, illustrates one process for making a semiconductor structure in accordance with embodiments of the present invention. FIG. 8A shows the semiconductor device of FIGS. 4-6 prior to forming the segmented bond pads. In this embodiment, a third inter level dielectric layer 157 is formed over the second etch stop liner 165. A first masking layer 190 is formed over the third inter level dielectric layer 157. The first masking layer 190 may be, for example, a photoresist layer. In one embodiment, an opening 195 is formed through the first masking layer 190 to expose the third inter level dielectric layer 157.

Figure 8B:
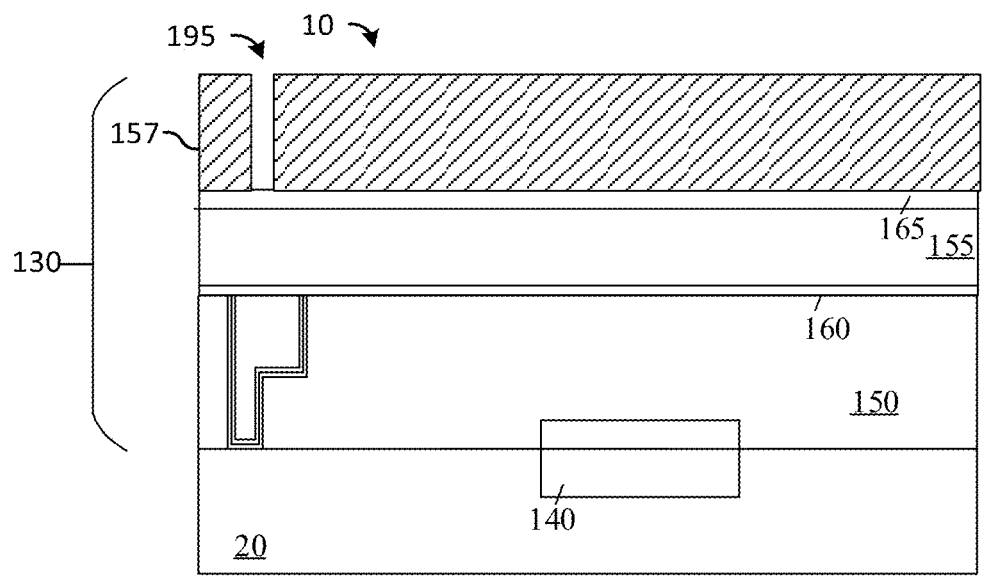

In FIG. 8B, the opening 195 is extended through the third inter level dielectric layer 157 and stops at the second etch stop liner 165. The first masking layer 190 has been removed in this embodiment.

Figure 8C:
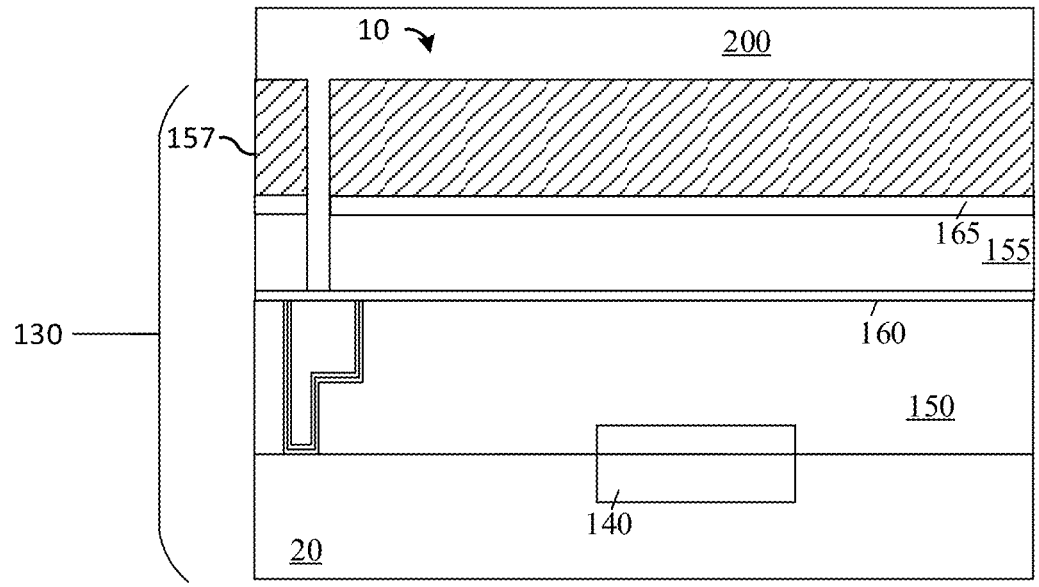

In FIG. 8C, the opening 195 is extended further into the second inter level dielectric layer 155 and through the second etch stop liner 165. The opening 195 is subsequently filled with a second masking layer 200 in this embodiment.

Figure 8D:
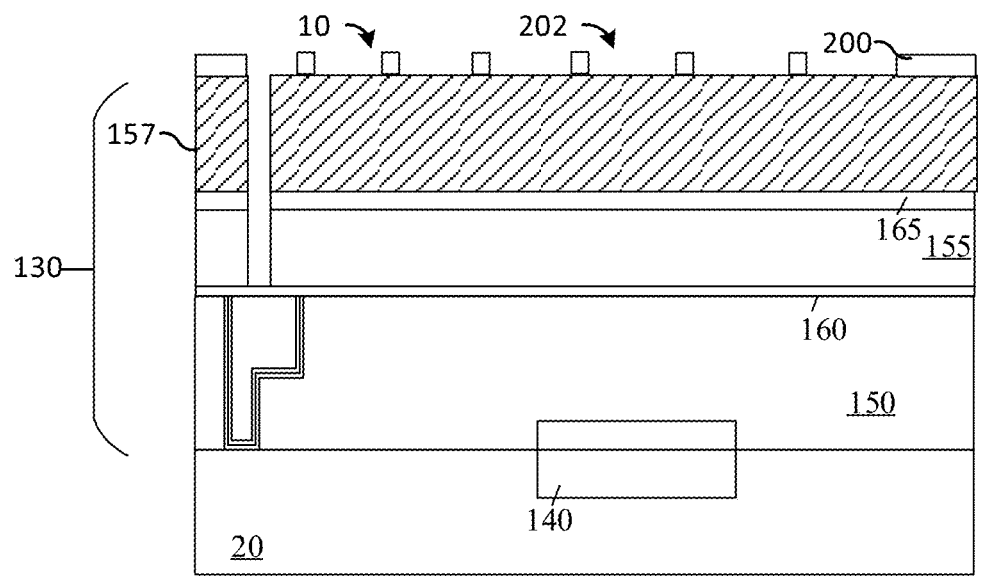

The second masking layer 200 is patterned as shown in FIG. 8D. The second masking layer 200 is patterned such that one or more openings 202 may be formed.

Figure 8E:
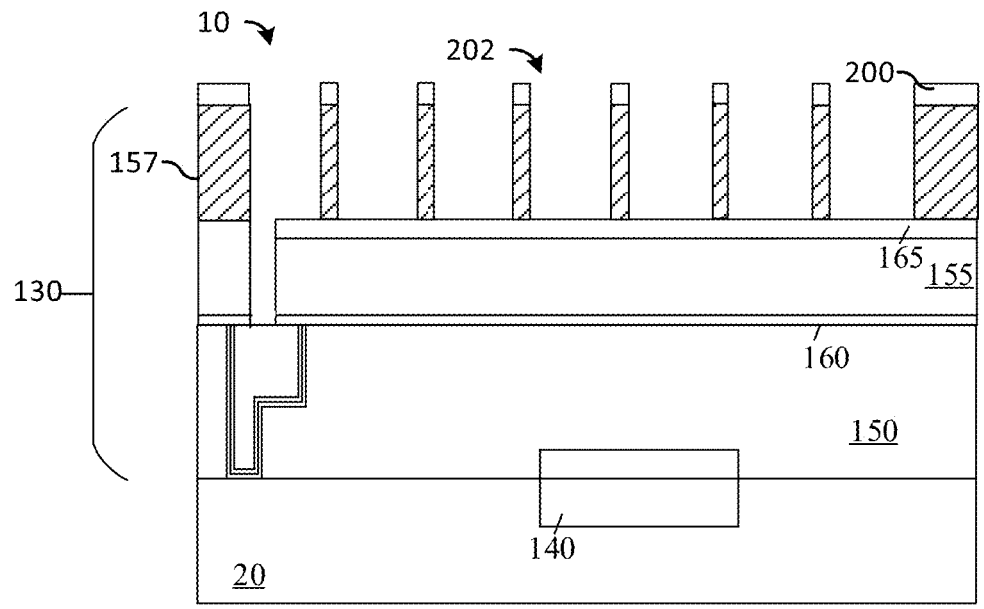

In FIG. 8E, the openings 202 are extended through the third inter level dielectric layer 157. The openings 202 will become the pad segments 80 in this example.

As depicted, the patterned second masking layer 200 is used as a mask in combination with an etch process to etch the third inter level dielectric layer 157. The etching in various embodiments is completed to form a desired geometry. For example, the etching may be completed to form the second opening 202 for the pad segments 80 in a triangular shape, a quadrilateral shape, a circular shape, a hexagonal shape, or some other configuration, as shown, for example, in FIG. 9. In some embodiments, one or more of the second etch stop liner 165, the second inter level dielectric layer 155, and the first etch stop liner 160 may also be etched.

Figure 8F:
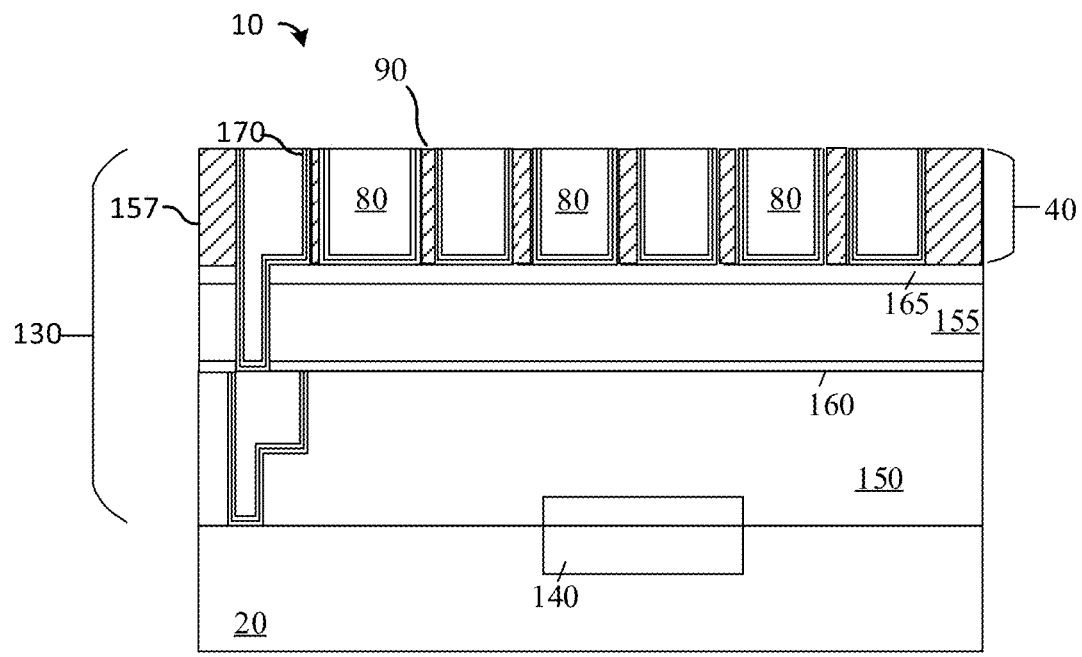

FIG. 8F shows the semiconductor chip 10 after a barrier layer and/or a seed layer have been formed over the semiconductor chip 10 and a conductive material has been deposited into each of the openings 202. The openings 202 filled with the conductive material form the pad segments 80 for the bond pad 40. The conductive material may comprise a metal or metal alloy, as discussed with respect to FIG. 1.

In alternative embodiments, an etching process may remove the dielectric material in the trenches 90. Next, the trenches 90 may be partially or completely filled with the filler material 180. In other words, the pad segments 80 may be formed by growing a seed layer and/or depositing a conductive material into the openings 202. Alternatively, a continuous metal layer may be deposited and etched such that the trenches 90 are formed. The trenches 90 may then be filled with filler material 180.

After both the trenches 90 and the pad segments 80 have been formed as desired, one or more wire bonds may be deposited on the surface of the bond pad 40. The pad segments 80 in direct contact with the wire bonds may be electrically active while the pad segments 80 not in direct contact with the wire bonds remain inactive.

Figure 9A:
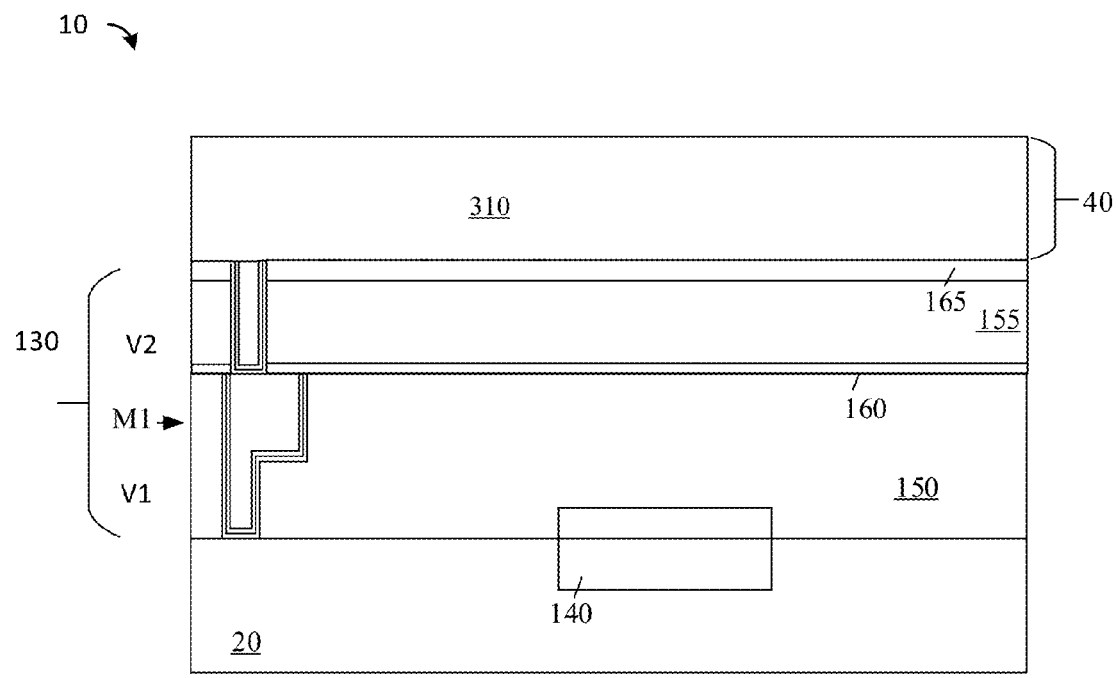
FIGS. 9A-9D, illustrates another process for making a semiconductor structure in accordance with embodiments of the present invention.

FIG. 9, which includes FIGS. 9A-9D, illustrates another process for making a semiconductor structure in accordance with embodiments of the present invention. FIG. 9A shows the semiconductor device of FIG. 7 prior to forming the segmented bond pads.

Referring to FIG. 9A, after forming the metal lines and vias of the metallization layer 130, a conductive layer 310 is deposited. The conductive layer 310 comprises a metal that is patternable using subtractive etching techniques in various embodiments. For example, in one embodiment, a layer stack comprising a first protective liner such as titanium nitride may be deposited followed by the deposition of a layer of aluminum. An additional layer of titanium nitride may be deposited over the aluminum layer. The conductive layer 310 is deposited as a blanket layer over the substrate 20. In various embodiments, the conductive layer 310 may be deposited using any suitable deposition process such as sputtering, vapor deposition, and others.

Figure 9B:
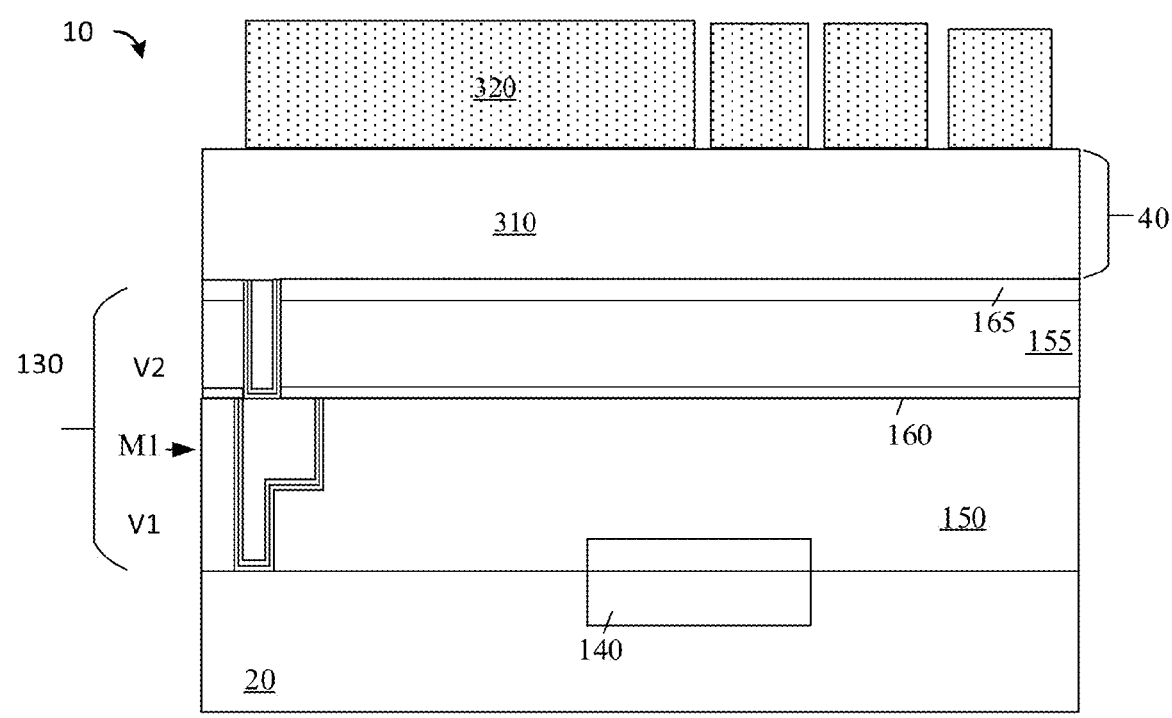

Referring to FIG. 9B, a resist layer 320 is formed over the unstructured conductive layer 310 and patterned. The resist layer 320 may include a hard mask layer in one embodiment. The resist layer 320 may be patterned using conventional lithography techniques in one embodiment. In other embodiments, other methods may be used to form a structured resist layer 320, for example, stencil printing, stamping, printing, and others.

Figure 9C:
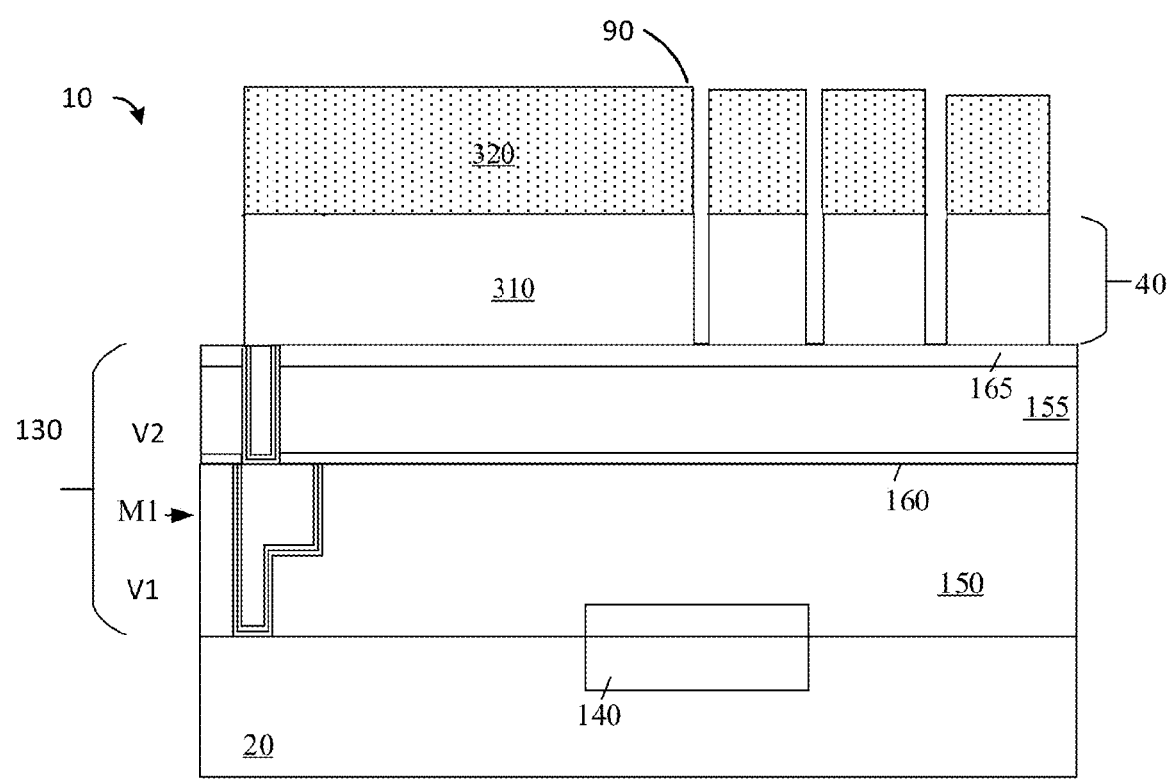

As next illustrated in FIG. 9C, using the resist layer 320 as a etch mask, the conductive layer 310 is patterned. The conductive layer 310 may be patterned using a reactive ion etching in one embodiment. In further embodiments, other types of etching or lift-off process may be used.

Figure 9D:
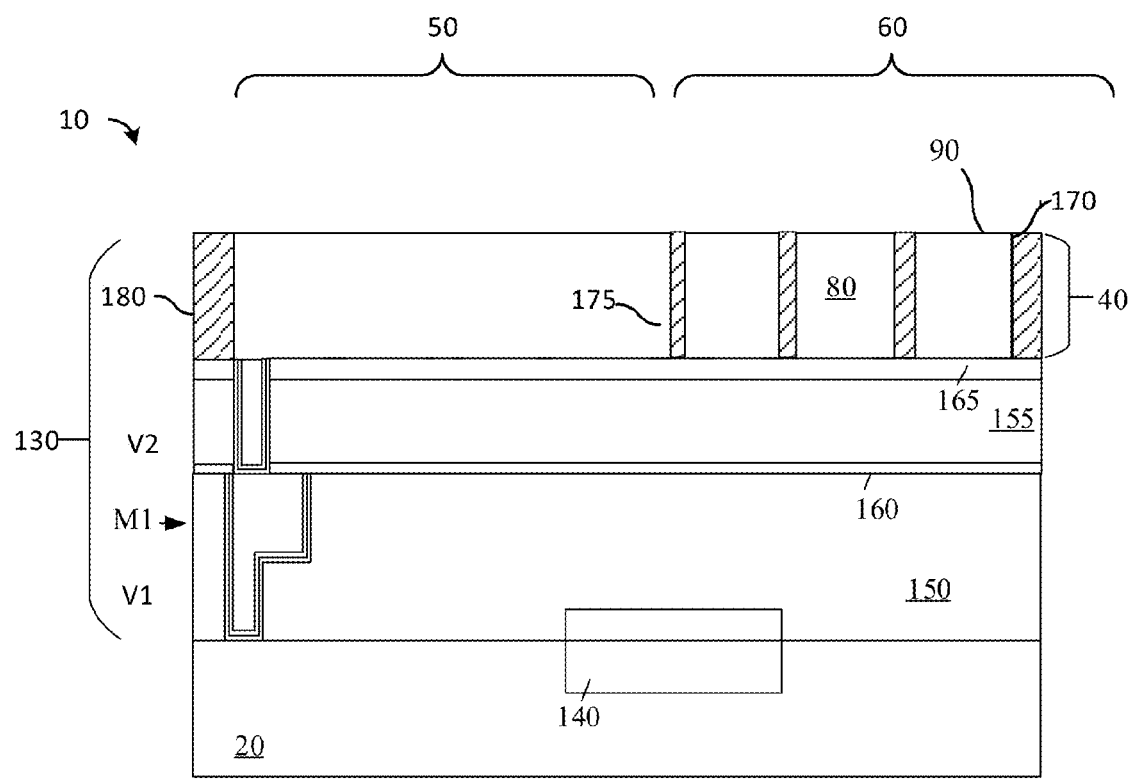

Referring next to FIG. 9D, in some embodiments, a further dielectric layer such as filler material 180 may be optionally introduced in the trenches 90 between the pad segments 80. Further processing if required may proceed as described earlier.

Figure 10A:
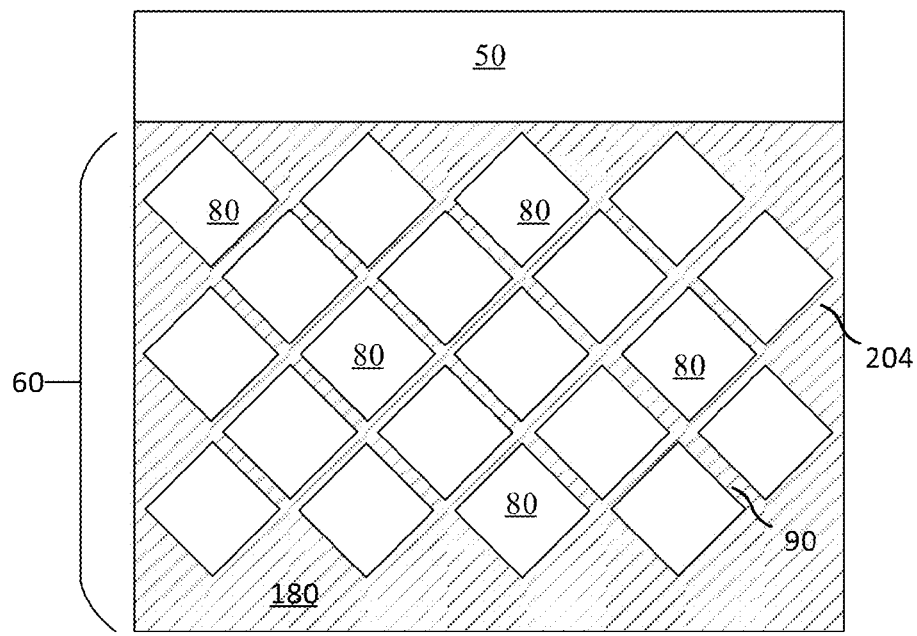
FIGS. 10A-10D, illustrates different configurations of a bond pad of a semiconductor device in accordance with an embodiment of the present invention.
Figure 10B:
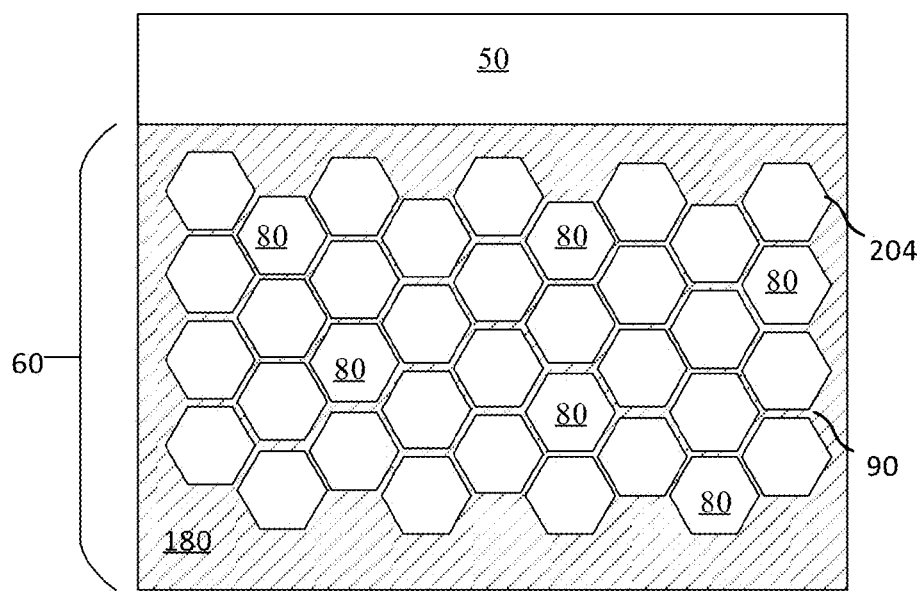
Figure 10C:
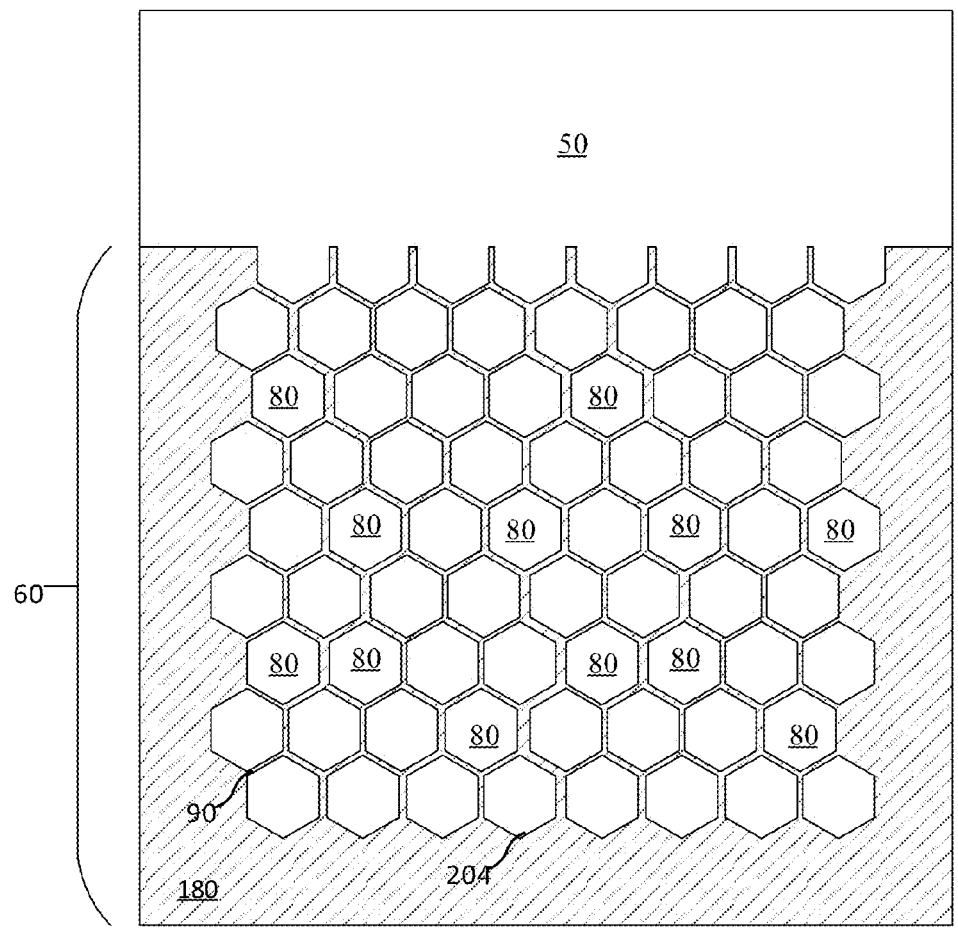
Figure 10D:
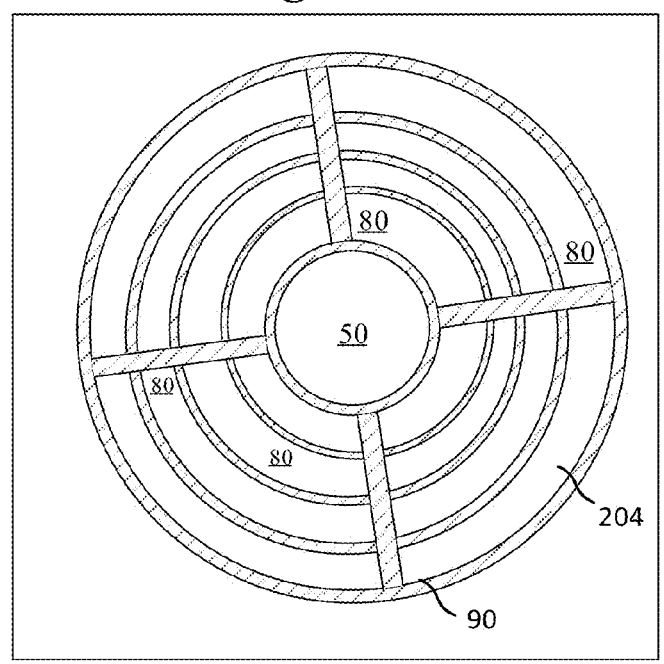

FIG. 10, which includes FIGS. 10A-10D, illustrates different configurations of a bond pad of a semiconductor device in accordance with an embodiment of the present invention. FIG. 10A shows a quadrilateral pad segment design, while FIG. 10B illustrates a honeycomb pad segment design. FIG. 10C shows a honeycomb pad segment the first row of pad segments had been merged with the unstructured part of the bond pad. FIG. 10D shows a pad segment configuration used for ball bonding.

Referring to FIG. 10A, a section 204 of the pad segments 80 has a quadrilateral shape. In some embodiments, the length of each side of a pad segment may be about 20 μm. The trenches 90 between each of the pad segments 80 in this example may be about 3 μm wide. In other embodiments, the length of the sides of the pad segments 80 and/or the width of the trenches 90 may be of different sizes, depending on the implementation. For instance, the space between the trenches 90 may be 2 μm, 4 μm, 5 μm, or some other suitable distance.

As can be seen from this illustrative example, the pad segments 80 are rotated 45 degrees from the horizontal. In other words, the trenches 90 are formed diagonally on the bond pad 40 such that the pad segments 80 may be insensitive to lateral shear stress during, for example, wedge bonding. Accordingly, the pad segments 80 in this embodiment resist shear stress during bonding and provide a strong mechanical connection for a wire bond.

In FIG. 10B, the section 204 of the second portion 60 of the bond pad 40 is shown with a honeycomb configuration. With this configuration, each of the pad segments 80 may comprise a hexagonal shape with a diameter of 20 μm, for example.

As depicted, the trenches 90 are formed around all six sides of each of pad segments 80. The trenches 90 in this embodiment may be smaller, larger, or the same size as the trenches 90 in FIG. 10A. Similar to the quadrilateral shape in FIG. 10A, the hexagonal shape of the pad segments 80 in FIG. 10B may provide mechanical stability and limit the effect of lateral shear stress during wire bonding.

Referring to FIG. 10C, in one or more embodiments, the first portion 50 may also be patterned so as to include edges and sidewalls that are aligned with the pattern of the second portion 60. Thus, in this embodiment, hexagonal shaped portions extend from the first portion 50 towards other pad segments 80.

In an alternative embodiment, a ball bond configuration for the pad segments 80 is illustrated in FIG. 10D. This configuration may be used for ball bonding the bond pad 40 of a logic chip or some other low power device. In this embodiment, the pad segments 80 are split into circular segments, in the section 204, arranged around the first portion 50.

In this illustration, the active area 110 of the ball bond is the center circular portion of the bond pad 40, which corresponds to the first portion 50. The inactive area 120 comprises substantially all of the pad segments 80 in this illustrative embodiment. In other words, the ball bond may be arranged to electrically connect only the first portion 50 of the bond pad 40 in various embodiments.

The trenches 90 surround each of the pad segments 80 and run continuously around the active area 110 to provide electrical isolation of the pad segments 80 from the active area 110. This embodiment of the pad segments 80 also may provide the desired shear strength while limiting the parasitic bond pad capacitance of the device.

Other variations and configurations of the pad segments 80 may be realized with reference to other illustrative embodiments. For example, the pad segments 80 may be cylindrical, octagonal, circular, triangular, or arranged in some other configuration. Moreover, in some embodiments, the diameter of the pad segments 80 may be greater or less than 20 μm. In still other embodiments, some of the pad segments 80 may have different diameters from one another or may be spaced differently from one another. Of course, one of ordinary skill in the art with the benefit of this disclosure may design such pad segments 80 to conform to desired specifications, depending on the particular implementation.

Figure 11A:
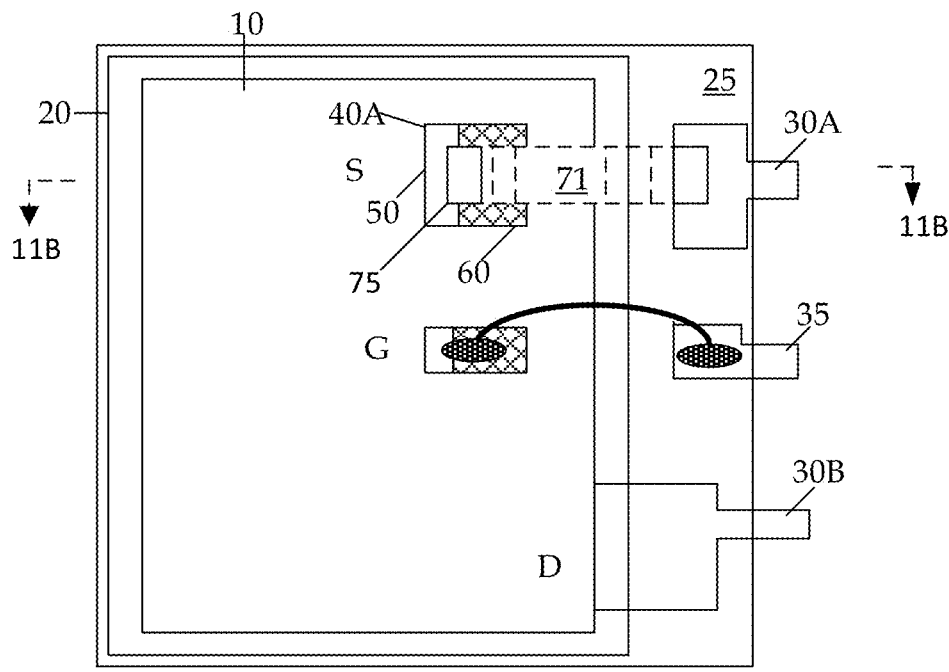
FIGS. 11A and 11B, illustrates a semiconductor device illustrating a clip interconnect in accordance with an embodiment of the present invention.
Figure 11B:
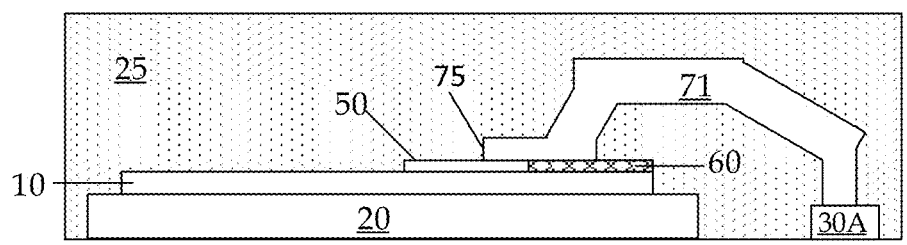

FIG. 11, which includes FIGS. 11A and 11B, illustrates a semiconductor device illustrating a clip interconnect in accordance with an embodiment of the present invention. FIG. 11A illustrates a top view while FIG. 11B illustrates a cross-sectional view.

In this embodiment, the first bond pad 40A, e.g., coupled to a source node, may be coupled to the first lead 30 through a interconnect 71, which is a clip in one embodiment. In another embodiment, the interconnect 71 may be a ribbon or a plate. The interconnect 71 may be a plate like structure with a lower resistance than the wire bonds. Therefore, in some embodiments, the high current paths may use the clip interconnect while the low current paths may use the wire bonds. The other bond pads such as the second bond pad 40B, e.g., coupled to a gate node, may be coupled to the second lead 35. As also illustrated, the drain lead 30B may be coupled to the drain bond pad on the semiconductor chip 10 directly through the die paddle of the substrate 20, for example, the drain bond pad may be disposed on the opposite side of the semiconductor chip 10 facing the die paddle.

As in prior embodiments, the interconnect 71 is coupled to the first bond pad 40A such that it overlaps with the first portion 50 and also the second portion 60 comprising the pad segments 80. This overlap region, which is under the bond foot 75 is electrically coupled and active but is isolated from the other pad segments 80 of the first bond pad 40A. As in prior embodiments, the semiconductor chip 10, the substrate 20, and the wires 70, and the interconnect 71 may all be embedded in an encapsulant 25.

Figure 12:
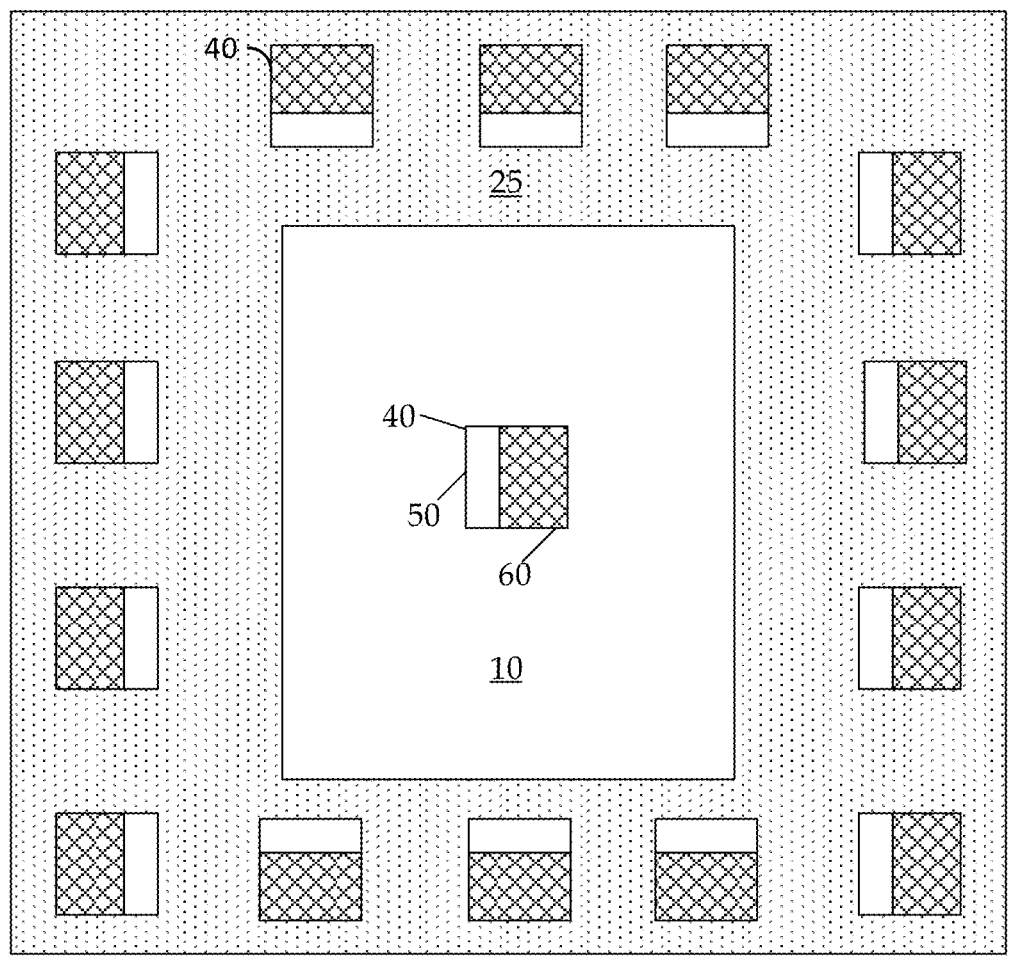
FIG. 12 illustrates a wafer level semiconductor package in accordance with an alternative embodiment of the invention.

FIG. 12 illustrates a wafer level semiconductor package in accordance with an alternative embodiment of the invention.

Embodiments of the present invention may also be applied to bond pads in semiconductor packages such as wafer level processing (WLP) packages. For example, FIG. 12 illustrates a fan-out semiconductor package comprising a plurality of bond pads. One or more of the plurality of bond pads 40 of the semiconductor package may comprise pad segments 80 as described in various embodiments in accordance to the present invention. The bond pads 40 may be disposed in an encapsulant 25, which may be coupled to the substrate 10 through redistribution lines.

FIG. 13, which includes FIGS. 13A-13D, illustrates an alternative configuration of a bond pad for use as solder pad of a semiconductor device in accordance with an embodiment of the present invention.

Figure 13A:
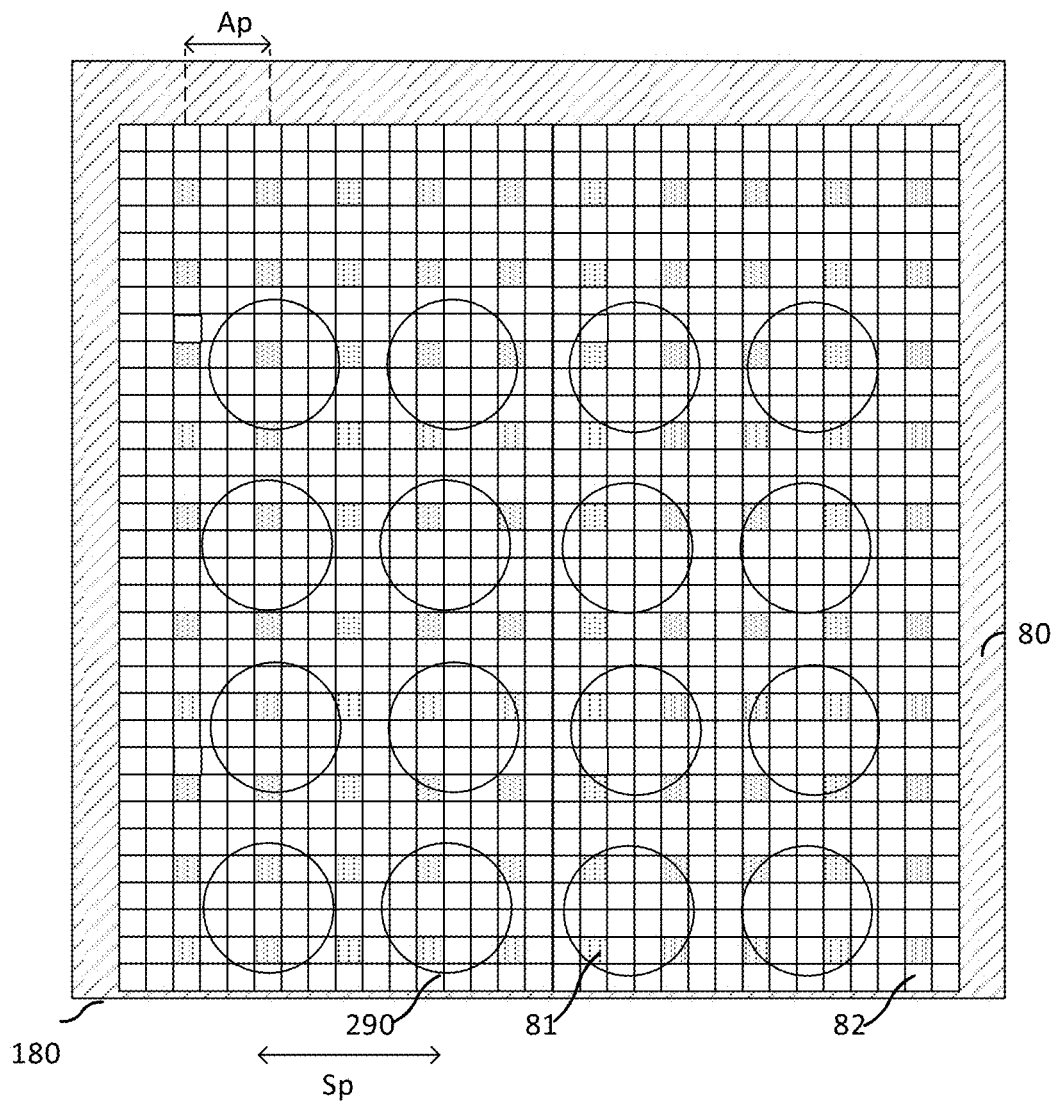
FIGS. 13A-13D, illustrates an alternative configuration of a bond pad for use as solder pad of a semiconductor device in accordance with an embodiment of the present invention.
Figure 13B:
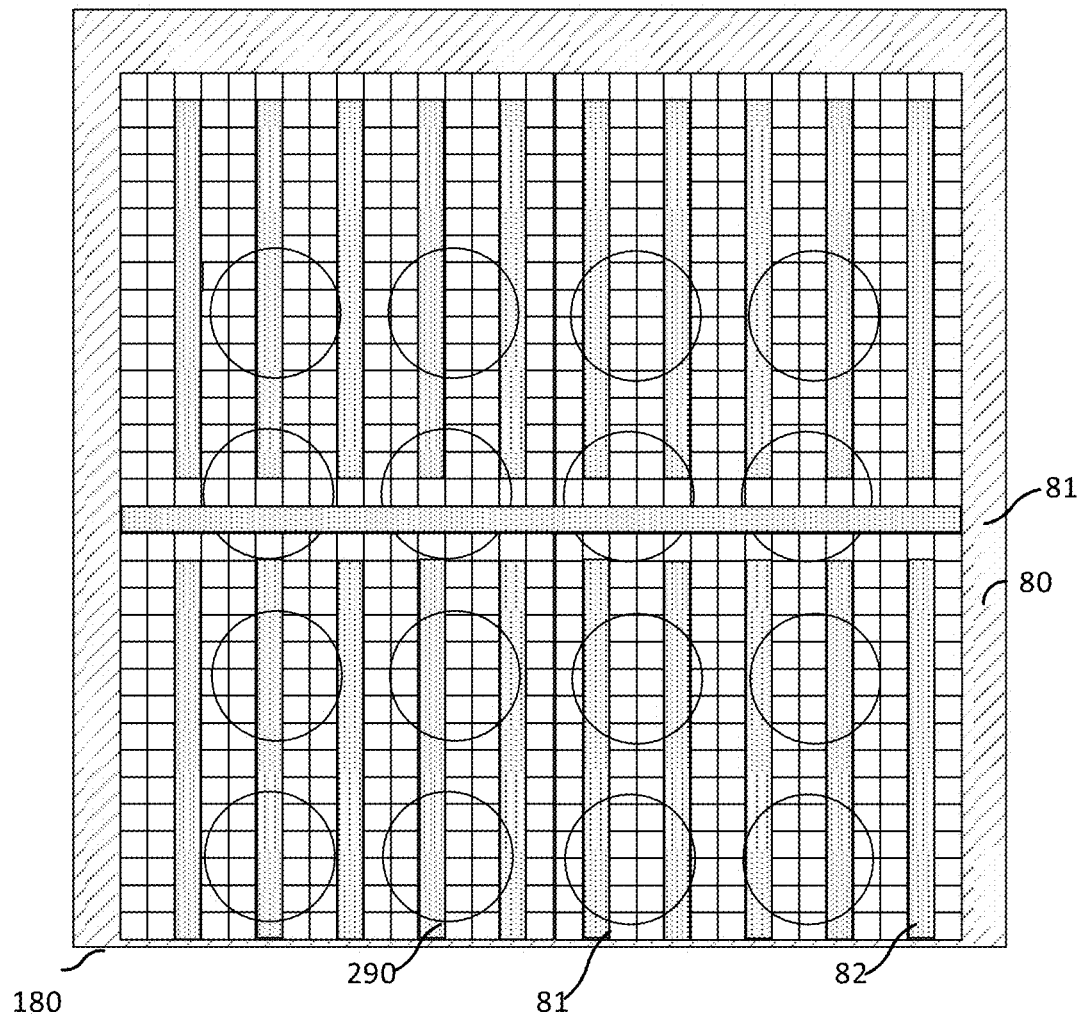
Figure 13C:
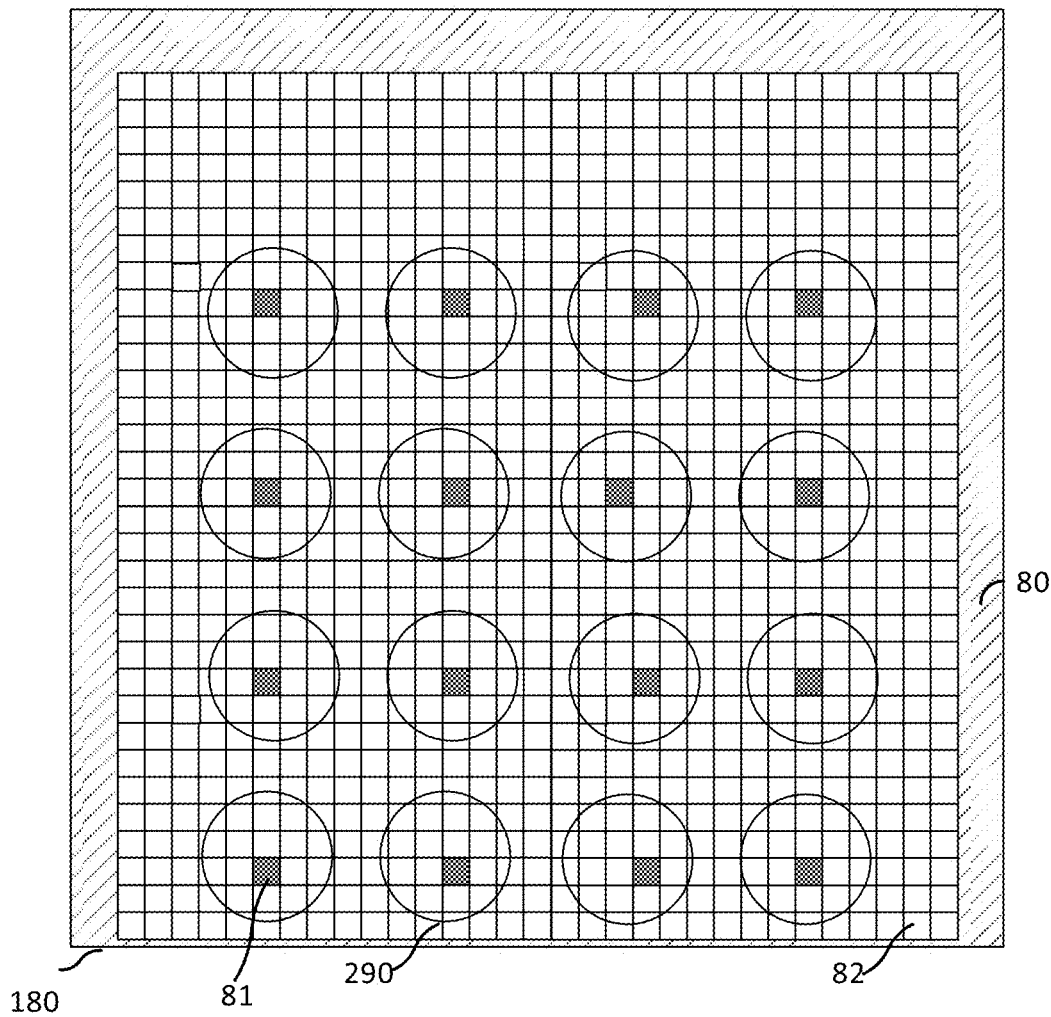
Figure 13D:
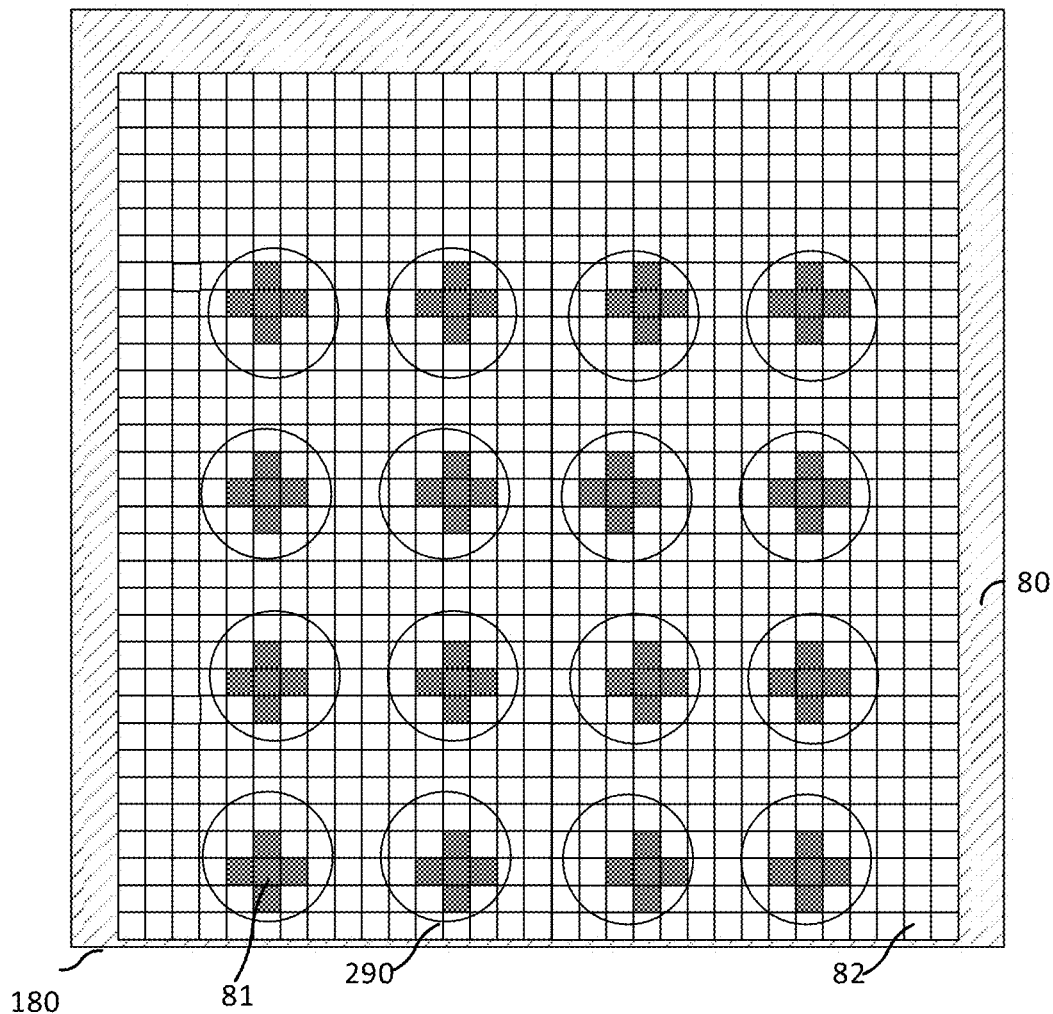

Unlike the prior embodiments, in this embodiment, the segmented bond pad is soldered. Accordingly, in this embodiment, the solid portion may be divided across many regions of the bond pad. FIG. 13A illustrates a top view of a bond pad 40 surrounded by an optional filler material 180 as described previously. However, in this embodiment, the regions, which are active pad segments 81 of the pad segments 40 are coupled to the substrate 20 below. The remaining regions that are isolated pad segments 82 of the pad segments 40 are isolated from the active pad segments 81. Thus, one or more solder ball bonds 290 may be formed over the bond pad 40. By varying the design and pattern of the active pad segments 81, proper contact may be established, i.e., the contact resist of the bond pad may be controlled to be within acceptable limits. FIG. 13A illustrates a pattern where the active pad segments 81 are separated by a isolated pad segments 82. In various embodiments, the relative pitch of the active pad segments to the pitch of the solder ball spacing may be varied along with the density (size) of the active pad segments. In one or more embodiments, the pitch of the active pad segments Ap may be smaller than the pitch of the solder ball bonds Sp. This ensures that each solder bond pad 290 has at least one active pad segment 81 underneath. In various embodiments, one or more active pad segments 81 may be present underneath each solder ball. After the solder ball bond 290 is formed, all the pad segments 80 including some of the isolated pad segments 82 under the solder ball bond 290 are electrically coupled. In FIG. 13B, the active pad segments 81 are formed as an elongated segment. In a different alternative embodiment, each active pad segment 81 has one solder ball bond 290. For example, this embodiment may be used to ensure that each solder ball is coupled with the same contact resistance.

Embodiments of the present invention also include other designs for the active pad segments. For example, in another embodiment, in FIG. 13D, a star like configuration is used to improve contact resistance. In this embodiment, four active pad segments 81 are disposed under each solder ball bonds 290.

Additionally, the pad segments 80 may be formed in various shapes and pattern in various embodiments. In one or more embodiments, the pad segments 80 may be square shaped, hexagonal shaped, arbitrary shaped, concentric arrangements of the solder pad segments 80 around the center of the contact point of a solder ball to the bond pad 40, for example, as in FIG. 10D. In various embodiments, the designs of FIG. 10 may be combined with FIG. 13.

Various embodiments of the present invention provide a bond pad and method of fabricating a semiconductor chip that significantly reduces the bond pad to substrate capacitance by segmenting a portion of the bond pad. The illustrative embodiments may be used with bond pads in a variety of applications. For example, segmented bond pads may be used in high-frequency (e.g., 0.1-100 GHz or higher) low and high power products in the semiconductor industry.

The illustrative embodiments offer advantages in the bond to substrate capacitance on one or more of the source, drain, or gate electrodes on discrete chips and logic chips, among others. With lower power applications, the illustrative embodiments increase signal performance. With high power applications, the illustrative embodiments promote power efficiency.

Additionally, the illustrative embodiments may be used with various types of bonding. For instance, with higher power applications, ultrasonic bonds, namely, wedge bonds, are used. In lower power applications such as with logic chips, ball bonds may be used. Various embodiments provide advantages for ball bonding, wedge bonding, and other suitable wire bonding techniques to reduce the bond pad to substrate capacitance while maintaining suitable connection both electrically and mechanically.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, or a copper intermetallic.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-13 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

What is claimed is:

1. A semiconductor device comprising:
a first bond pad disposed at a first side of a substrate, the first bond pad comprising a first plurality of conductive pad segments, wherein each of the conductive pad segment of the first plurality of conductive pad segments is electrically isolated from the remaining conductive pad segments of the first plurality of pad segments, wherein one of the first plurality of conductive pad segments is larger in area than the remaining conductive pad segments of the first plurality of conductive pad segments, and wherein top surfaces of all of the plurality of conductive pad segments are coplanar.

2. The device of claim 1, further comprising a second bond pad spaced from the first bond pad disposed at the first side, the second bond pad comprising a second plurality of conductive pad segments, wherein at least one pad segment of the second plurality of conductive pad segments is electrically isolated from the remaining conductive pad segments of the second plurality of conductive pad segments.

3. The device of claim 2, wherein the first bond pad is coupled to a source node of a transistor, and wherein the second bond pad is coupled to a gate node of the transistor.

4. The device of claim 2, wherein the first bond pad is coupled to a drain node of a transistor, and wherein the second bond pad is coupled to a gate node of the transistor.

5. The device of claim 1, wherein each of the first plurality of conductive pad segments is separated from an adjacent conductive pad segment of the first plurality of conductive pad segments by a plurality of openings.

6. The device of claim 5, wherein the plurality of openings comprise a dielectric material.

7. The device of claim 1, wherein the semiconductor device comprises a discrete semiconductor device.

8. The device of claim 1, wherein the semiconductor device comprises an integrated circuit.

9. The device of claim 1, wherein the first bond pad is a solder pad.

10. The device of claim 1, wherein the first plurality of pad segments comprises quadrilateral shaped pad segments arranged on a first plane in a direction inclined to a major edge of the first bond pad, wherein the first plane is parallel to a major surface of the first bond pad.

11. The device of claim 1, wherein the first plurality of pad segments comprise hexagonal shaped pad segments.

12. The device of claim 1, wherein the first plurality of pad segments comprise a ball bond configuration having concentric segments around a center region as viewed on a first plane, wherein the first plane is parallel to a major surface of the first bond pad.

13. A semiconductor device comprising:
a first bond pad disposed at a first side of a substrate, the first bond pad comprising a first portion and a second portion comprising a first plurality of conductive pad segments, wherein the first portion of the first bond pad is electrically coupled to the substrate, wherein the second portion of the first bond pad is electrically isolated from the substrate, wherein a contact area of the first portion is larger than a contact area of each of pad segments of the second portion, and wherein a top surface of the first portion and a top surface of the second portion are coplanar.

14. The device of claim 13, wherein the first and the second portions of the first bond pad are configured to be coupled to a first common external interconnect.

15. The device of claim 13, wherein at least one pad segment of the first plurality of conductive pad segments is electrically isolated from the remaining pad segments of the first plurality of conductive pad segments.

16. The device of claim 15, wherein each of the first plurality of conductive pad segments is separated from an adjacent pad segment of the first plurality of conductive pad segments by a plurality of openings.

17. The device of claim 16, wherein the plurality of openings comprise a dielectric material.

18. The device of claim 13, further comprising a second bond pad spaced from the first bond pad disposed at the first side, the second bond pad comprising a first portion and a second portion, wherein the first portion of the second bond pad is electrically coupled to the substrate, and wherein the second portion of the second bond pad is electrically isolated from the substrate.

19. The device of claim 18, wherein at least one pad segment of the first plurality of conductive pad segments is electrically isolated from the remaining pad segments of the first plurality of conductive pad segments, wherein the second portion of the second bond pad comprises a second plurality of conductive pad segments, wherein at least one pad segment of the second plurality of conductive pad segments is electrically isolated from the remaining pad segments of the second plurality of conductive pad segments.

20. The device of claim 13, wherein the first plurality of conductive pad segments comprise quadrilateral shaped pad segments arranged on a plane parallel to a major surface of the first bond pad and in a direction inclined to a major edge of the first bond pad, or wherein the first plurality of conductive pad segments comprise hexagonal shaped pad segments, or wherein the first portion includes edges and sidewalls shaped to align with hexagonal shaped pad segments, or wherein the plurality of pad segments comprise a ball bond configuration having concentric segments arranged around a center region comprising the first portion.

21. A semiconductor device comprising:
a semiconductor chip having a first side;
a first bond pad disposed at the first side of the semiconductor chip, the first bond pad comprising a first portion comprising a single pad segment and a second portion, the second portion comprising a first plurality of conductive pad segments, wherein a pad segment of the first plurality of conductive pad segments is electrically isolated from the remaining pad segments of the first plurality of conductive pad segments and electrically isolated from the single pad segment of the first portion; and a first external interconnect contacting the first portion of the first bond pad, wherein a pad segment of the first plurality of conductive pad segments is electrically coupled to the single pad segment of the first portion only through the first external interconnect.

22. The device of claim 21, wherein the first external interconnect contacts the pad segment of the first plurality of conductive pad segments.

23. The device of claim 21, wherein the first external interconnect comprises a wire bond, a clip, or a ribbon.

24. The device of claim 21, further comprising:
a second bond pad spaced from the first bond pad disposed at the first side, the second bond pad comprising a first portion and a second portion comprising a second plurality of conductive pad segments, wherein at least one pad segment of the second plurality of conductive pad segments is electrically isolated from the remaining pad segments of the second plurality of conductive pad segments; and
a second external interconnect contacting the first portion of the second bond pad.

25. The device of claim 24, wherein the first external interconnect comprises a wire bond and the second external interconnect comprises a clip.

26. The device of claim 21, wherein the first plurality of conductive pad segments comprise quadrilateral shaped pad segments arranged on a plane parallel to a major surface of the first bond pad in a direction inclined to a major edge of the first bond pad, or wherein the first plurality of conductive pad segments comprise hexagonal shaped pad segments, or wherein the first portion includes edges and sidewalls shaped to align with hexagonal shaped pad segments, or wherein the plurality of pad segments comprise a ball bond configuration having concentric segments arranged around a center region comprising the first portion.

27. A semiconductor device comprising:
a semiconductor chip comprising a substrate and having a first side;
a first bond pad disposed at the first side of the semiconductor chip, the first bond pad comprising a first portion and a second portion separated from the first portion, wherein the first portion comprises a first plurality of conductive pad segments, wherein the second portion comprises a second plurality of conductive pad segments, wherein each of the first plurality of conductive pad segments of the first bond pad is electrically coupled to the substrate, and wherein each of the second plurality of conductive pad segments of the first bond pad is electrically isolated from the substrate; and
a first interconnect contacting the first portion, wherein a pad segment of the first plurality of conductive pad segments is electrically coupled to another pad segment of the first portion only through the first interconnect.

28. The device of claim 27, wherein each of the first plurality of conductive pad segments is surrounded by pad segments of the second plurality of conductive pad segments.

29. The device of claim 27, wherein each of the first plurality of conductive pad segments is about the same size as each of the second plurality of conductive pad segments.

30. The device of claim 27, wherein the first plurality of conductive pad segment comprise elongated segments, and wherein the first plurality of conductive pad segments are more elongated than the second first plurality of conductive pad segments.

31. The device of claim 27, wherein the first plurality of conductive pad segments are arranged in a star like configuration, and wherein pad segments of the second plurality of conductive pad segments surround each of the first plurality of conductive pad segments.

* * * * *

UNITED STATES PATENT AND TRADEMARK OFFICE
CERTIFICATE OF CORRECTION

PATENT NO. : 9,543,260 B2
APPLICATION NO. : 13/958276
DATED : January 10, 2017
INVENTOR(S) : Albert Birner et al.

It is certified that error appears in the above-identified patent and that said Letters Patent is hereby corrected as shown below:

In the Claims

In Column 18, Line 30, Claim 30, delete "second first plurality" and insert --second plurality--.

Signed and Sealed this
Nineteenth Day of June, 2018

Andrei Iancu
*Director of the United States Patent and Trademark Office*